US012588506B2

(12) United States Patent
Mayukh et al.

(10) Patent No.: US 12,588,506 B2
(45) Date of Patent: Mar. 24, 2026

(54) STACKED SEMICONDUCTOR METHOD AND APPARATUS

(71) Applicant: Avago Technologies International Sales Pte. Limited, Singapore (SG)

(72) Inventors: Mayank Mayukh, Fort Collins, CO (US); Anwar Ali, San Jose, CA (US); Jayanthi Pallinti, Los Gatos, CA (US); Shrikara Prabhu Tendel, Singapore (SG); Gregory Dix, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 619 days.

(21) Appl. No.: 17/946,883

(22) Filed: Sep. 16, 2022

(65) Prior Publication Data

US 2024/0096745 A1 Mar. 21, 2024

(51) Int. Cl.
H01L 23/46 (2006.01)
H01L 23/00 (2006.01)
H01L 23/48 (2006.01)

(52) U.S. Cl.
CPC ............ H01L 23/46 (2013.01); H01L 23/481 (2013.01); H01L 24/05 (2013.01); H01L 24/08 (2013.01);
(Continued)

(58) Field of Classification Search
CPC ........ H01L 24/83; H01L 23/46; H01L 23/481
See application file for complete search history.

(56) References Cited

U.S. PATENT DOCUMENTS 7,064,391 B1 * 6/2006 Conn ................ H01L 21/76256
257/353
9,142,517 B2 9/2015 Liu et al.
(Continued)

FOREIGN PATENT DOCUMENTS

DE 102017120875 A1 12/2018
EP 3910672 A1 11/2021
TW 1652773 B 3/2019

OTHER PUBLICATIONS

IEEE Xplore, "Nanotwinned Copper Hybrid Bonding and Wafer-On-Wafer Integration", URL: https://ieeexplore.ieee.org/document/9159510, Published in: 2020 IEEE 70th Electronic Components and Technology Conference (ECTC), 3 pages.
(Continued)

*Primary Examiner* — Dale E Page
*Assistant Examiner* — Wilner Jean Baptiste
(74) *Attorney, Agent, or Firm* — Quarles & Brady LLP

(57) ABSTRACT

A manufacturing method of a chip package, performing a coupling of first and second interconnecting layers between one or more top dies and one or more bottom dies via hybrid copper bonding; depositing a material to at least partially cover the second interconnecting layer; thinning a second surface of the one or more top dies, wherein both the one or more top dies and the material define a continuous surface; coupling a first surface of a support die to the second surface of at least one of the one or more top dies; thinning a second surface of at least one of the one or more bottom dies; and coupling the second surface of at least one of the one or more bottom dies to a plurality of microbumps.

11 Claims, 18 Drawing Sheets

(52) U.S. Cl.
CPC .............. *H01L 24/13* (2013.01); *H01L 24/29*
(2013.01); *H01L 24/32* (2013.01); *H01L 24/80*
(2013.01); *H01L 24/83* (2013.01); *H01L*
*2224/05647* (2013.01); *H01L 2224/08145*
(2013.01); *H01L 2224/131* (2013.01); *H01L*
*2224/29186* (2013.01); *H01L 2224/2929*
(2013.01); *H01L 2224/29324* (2013.01); *H01L*
*2224/29339* (2013.01); *H01L 2224/29347*
(2013.01); *H01L 2224/29393* (2013.01); *H01L*
*2224/29439* (2013.01); *H01L 2224/29447*
(2013.01); *H01L 2224/32225* (2013.01); *H01L*
*2224/80379* (2013.01); *H01L 2224/80895*
(2013.01); *H01L 2224/80896* (2013.01); *H01L*
*2224/8385* (2013.01)

(56) References Cited

U.S. PATENT DOCUMENTS

| | | | |
|---|---|---|---|
| 9,728,521 B2 | 8/2017 | Tsai et al. | |
| 10,784,202 B2 | 9/2020 | Arguin et al. | |
| 11,011,494 B2 | 5/2021 | Gao et al. | |
| 11,152,317 B2 | 10/2021 | Choi et al. | |
| 11,342,309 B2 | 5/2022 | Yu et al. | |
| 2015/0340327 A1* | 11/2015 | Uzoh | H01L 21/76898 |
| | | | 438/109 |
| 2016/0035704 A1* | 2/2016 | Luo | H01L 21/3065 |
| | | | 438/109 |
| 2020/0350310 A1 | 11/2020 | Or-Bach et al. | |
| 2020/0381397 A1* | 12/2020 | Yu | H01L 24/08 |
| 2022/0157757 A1 | 5/2022 | Seok et al. | |

OTHER PUBLICATIONS

IEEE Xplore, "Wafer-level hybrid bonding technology with copper/ polymer co-planarization", https://ieeexplore.ieee.brg/abstract/ document/5751471, Published in: 2010 IEEE International 3D Systems Integration Conference (3DIC), Date of Conference: Nov. 16-18, 2010, 4 pages.

Semiconductor Engineering, "Bumps Vs. Hybrid Bonding For Advanced Packaging", URL: https://semiengineering.com/bumps-vs-hybrid-bonding-for-advanced-packaging/, Jun. 23, 2021, 26 pages.

* cited by examiner

200

500

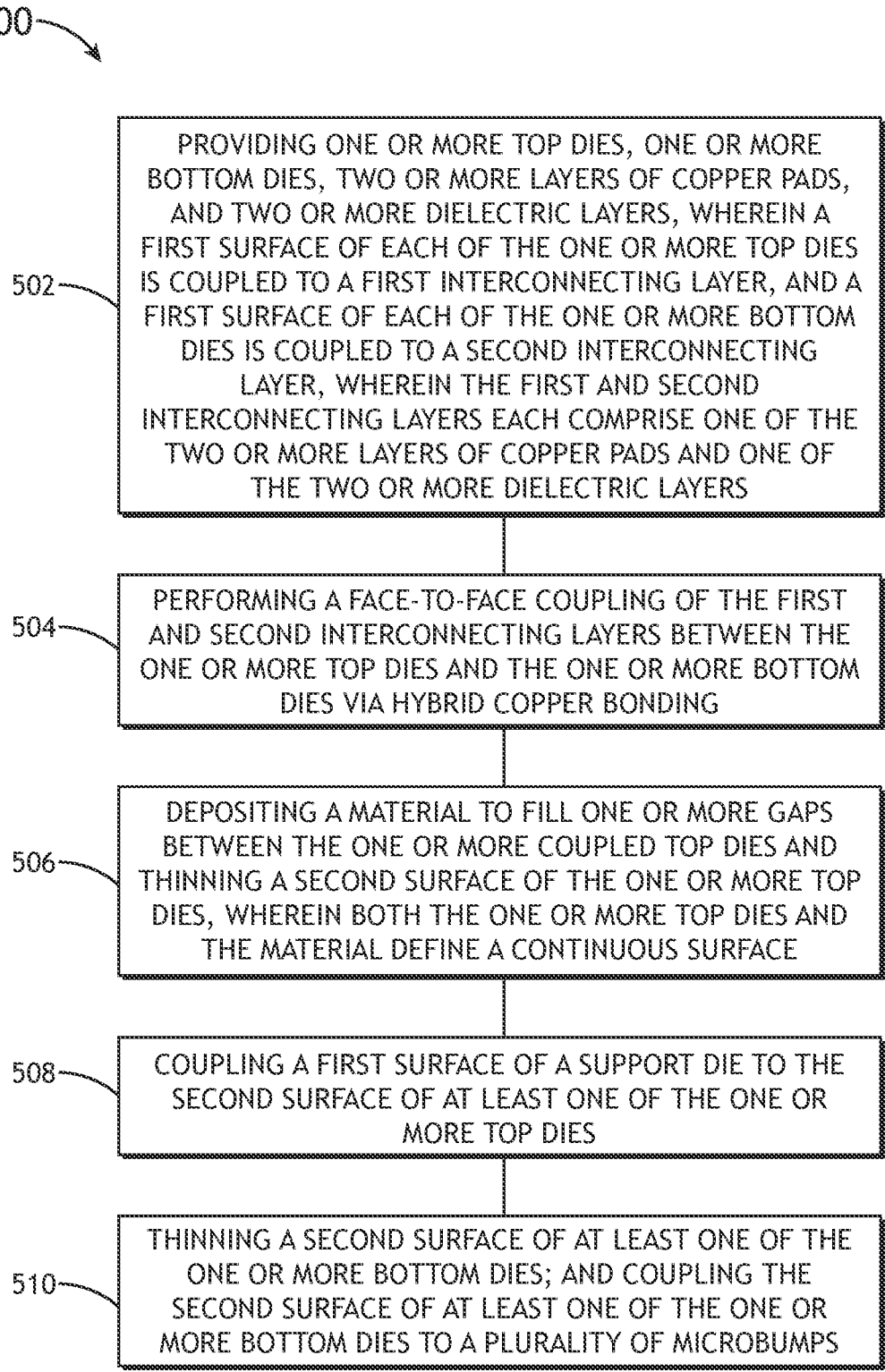

502 — PROVIDING ONE OR MORE TOP DIES, ONE OR MORE BOTTOM DIES, TWO OR MORE LAYERS OF COPPER PADS, AND TWO OR MORE DIELECTRIC LAYERS, WHEREIN A FIRST SURFACE OF EACH OF THE ONE OR MORE TOP DIES IS COUPLED TO A FIRST INTERCONNECTING LAYER, AND A FIRST SURFACE OF EACH OF THE ONE OR MORE BOTTOM DIES IS COUPLED TO A SECOND INTERCONNECTING LAYER, WHEREIN THE FIRST AND SECOND INTERCONNECTING LAYERS EACH COMPRISE ONE OF THE TWO OR MORE LAYERS OF COPPER PADS AND ONE OF THE TWO OR MORE DIELECTRIC LAYERS

504 — PERFORMING A FACE-TO-FACE COUPLING OF THE FIRST AND SECOND INTERCONNECTING LAYERS BETWEEN THE ONE OR MORE TOP DIES AND THE ONE OR MORE BOTTOM DIES VIA HYBRID COPPER BONDING

506 — DEPOSITING A MATERIAL TO FILL ONE OR MORE GAPS BETWEEN THE ONE OR MORE COUPLED TOP DIES AND THINNING A SECOND SURFACE OF THE ONE OR MORE TOP DIES, WHEREIN BOTH THE ONE OR MORE TOP DIES AND THE MATERIAL DEFINE A CONTINUOUS SURFACE

508 — COUPLING A FIRST SURFACE OF A SUPPORT DIE TO THE SECOND SURFACE OF AT LEAST ONE OF THE ONE OR MORE TOP DIES

510 — THINNING A SECOND SURFACE OF AT LEAST ONE OF THE ONE OR MORE BOTTOM DIES; AND COUPLING THE SECOND SURFACE OF AT LEAST ONE OF THE ONE OR MORE BOTTOM DIES TO A PLURALITY OF MICROBUMPS

FIG.5

STACKED SEMICONDUCTOR METHOD AND APPARATUS

BACKGROUND

As semiconductor packages increase in capability and more processors and logic circuitry are added, the thermal conductivity and structural support between the components of the semiconductor packages becomes more difficult to manage. There is a need for improving the thermal conductivity and structural support between the components of a semiconductor package to improve the yield and durability of the packages. For example, interconnecting dies by stacking them within a package increases the interconnect density but presents unresolved mechanical and thermal challenges. Semiconductor packages may include interconnecting components with enhanced capabilities to provide support to the package. The interconnecting components may also include abilities to conduct thermal heat dissipation and utilize active cooling throughout the package. The ability to provide the support, conduct thermal heat dissipation, and utilize active cooling allows the semiconductor packages to have a higher power density, durability, and efficiency. Additionally, a common process flow utilizing hybrid copper bonding may be needed to satisfy multiple configurations of manufactured semiconductor packages and to minimize supply chain complexity, while meeting the product requirements for signal bandwidth, power delivery network (PDN), and thermal dissipation.

SUMMARY

In one aspect, embodiments of the inventive concepts disclosed herein are directed to a method. The method providing one or more top dies, one or more bottom dies, two or more layers of copper pads, and two or more dielectric layers, wherein a first surface of each of the one or more top dies is coupled to a first interconnecting layer, and a first surface of each of the one or more bottom dies is coupled to a second interconnecting layer. The first and second interconnecting layers may include one of the two or more layers of copper pads and one of the two or more dielectric layers. Together, a face-to-face coupling of the first and second interconnecting layers between the one or more top dies and the one or more bottom dies includes a filler between the one or more coupled top dies. A surface of the one or more dies is thinned to define a continuous surface. The surface of a support die to the second surface of at least one of the one or more top dies is coupled. In operation, successive layers of top dies may be stacked before the surface of the support die to the second surface of at least one of the one or more top dies is coupled.

In a further aspect, the embodiments of the inventive concepts disclosed herein are directed to a chip package. The chip package may include one or more top dies, one or more bottom dies, two or more layers of copper pads, two or more dielectric layers, a first interconnecting layer, a second interconnecting layer, a material, a support die, and a plurality of microbumps. A first surface of each of the one or more top dies is coupled to the first interconnecting layer and a first surface of each of the one or more bottom dies is coupled to the second interconnecting layer. The first and second interconnecting layers each may include one of the two or more layers of copper pads and one of the two or more dielectric layers. Together the first and second interconnecting layers between the one or more top dies and the one or more bottom dies are coupled face-to-face via hybrid copper bonding. A material is deposited between the one or more coupled top dies. The surface of the support die is coupled to a second surface of the one or more top dies. The plurality of microbumps is coupled to a second surface of at least one of the one or more bottom dies.

In a further aspect, the embodiments of the inventive concepts disclosed herein are directed to a semiconductor package. The semiconductor package is obtained by a process. The process providing fabricating one or more chip packages. The fabricated chip packages are obtained from a method. The method providing one or more top dies, one or more bottom dies, two or more layers of copper pads, and two or more dielectric layers, wherein a first surface of each of the one or more top dies is coupled to a first interconnecting layer, and a first surface of each of the one or more bottom dies is coupled to a second interconnecting layer. The first and second interconnecting layers each may include one of the two or more layers of copper pads and one of the two or more dielectric layers. Together a face-to-face coupling of the first and second interconnecting layers between the one or more top dies and the one or more bottom dies includes depositing a material to fill one or more gaps between the one or more top dies. A surface of the one or more dies is thinned to define a continuous surface. The surface of a support die to the second surface of at least one of the one or more top dies is coupled. In operation, successive layers of top dies may be stacked before the surface of the support die to the second surface of at least one of the one or more top dies is coupled.

The second surface of at least one of the one or more bottom dies is coupled to a first plurality of microbumps. The one or more fabricated chip packages are coupled to an interposer. A second surface of the interposer is coupled to a second plurality of microbumps. The second plurality of microbumps is coupled to a first surface of a substrate. A second surface of the substrate is coupled to a third plurality of microbumps.

This Summary is provided solely as an introduction to subject matter that is fully described in the Detailed Description and Drawings. The Summary should not be considered to describe essential features nor be used to determine the scope of the claims. Moreover, it is to be understood that both the foregoing Summary and the following Detailed Description are example and explanatory only and are not necessarily restrictive of the subject matter claimed. The accompanying drawings, which are incorporated in and constitute a part of the specification, illustrate exemplary embodiments of the inventive concepts disclosed herein and together with the general description, serve to explain the principles.

Some drawings may describe process flows for fabricating devices, the process flows, which may be a sequence of steps for fabricating a device, may have many structures, numerals, labels that may be common between two or more successive steps. In such cases, some labels, numerals, and structures used for a certain step's figure may have been described in the previous steps' figures.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. The numerous advantages of the embodiments of the inventive concepts disclosed herein may be better understood by those skilled in the art by reference to the accompanying figures.

FIG. 5 shows a flow diagram of a process flow for manufacturing a chip package.

DETAILED DESCRIPTION

Figure 1A:
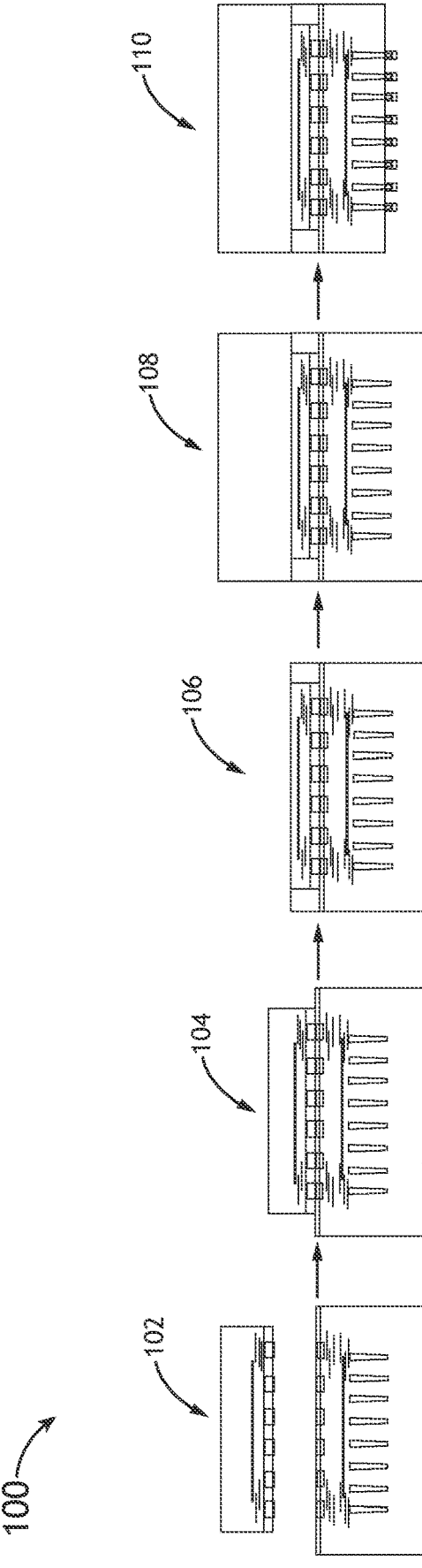
FIG. 1A shows a method for manufacturing a chip package using hybrid copper bonding.

Reference will now be made in detail to the subject matter disclosed, which is illustrated in the accompanying drawings.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

Some drawings may describe process flows for fabricating devices. the process flows, which may be a sequence of steps for fabricating a device, may have many structures, numerals, labels that may be common between two or more successive steps. In such cases, some labels, numerals, and structures used for a certain step's figure may have been described in the previous steps' figures.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

As used herein, directional terms such as "vertically," "horizontally," "top," "bottom," "over," "under," "upper," "upward," "lower," "down," and "downward" are intended to provide relative positions for purposes of description and are not intended to designate an absolute frame of reference. Various modifications to the described embodiments will be apparent to those with skill in the art, and the general principles defined herein may be applied to other embodiments.

It is to be understood that depicted architectures are merely exemplary and that many other architectures can be implemented which achieve the functionality described herein. When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present. Rather, such components may be in physical contact or may alternatively include intervening elements. Similarly, descriptions that a particular component is "fabricated over" another component (alternatively "located on," "disposed on," or the like) indicates a relative position of such components but does not necessarily indicate that such components are physically in contact. Such components may be in physical contact or may alternatively include intervening elements.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of or sub-combination of two or more such features, along with any other features which may not necessarily be expressly described or inherently present in the instant disclosure.

Broadly, embodiments of the inventive concepts disclosed herein are directed to a manufacturing method of a chip package, a chip package obtained from the manufacturing method, and a semiconductor package obtained by using the manufacturing method as part of a process flow for fabricating the semiconductor package. A chip package may refer to a die mounted on a package substrate (e.g., another die). A semiconductor package may refer to the chip package mounted on a package substrate (e.g., an interposer or another substrate). The semiconductor package may also be referred to as a module. The embodiments of the chip package and the semiconductor package may include a bonding film and a support die with inventive concepts disclosed herein that further support the thermal conductivity and structural support of the chip package and the semiconductor package.

Referring to FIG. 1A, a method 100 for manufacturing a chip package using hybrid copper bonding is shown, in accordance with one or more embodiments of the present disclosure. The method 100 includes a first step 102, a second step 104, a third step 106, a fourth step 108, and a fifth step 110 for manufacturing the chip package. A front cross-sectional view of each step 102, 104, 106, 108, 110 is shown. The method 100 may be a common process flow for manufacturing a chip package using hybrid copper bonding. The common process flow disclosed in FIG. 1A may allow a manufacturer to simplify the manufacturing process of chip packages that may be coupled using hybrid copper bonding. A common process flow may satisfy multiple configurations of manufactured semiconductor packages and may minimize supply chain complexity. The common process flow may also meet product requirements for signal bandwidth, power delivery network (PDN), and thermal dissipation. The fifth step 110 shown in the method 100 may resemble an embodiment of a chip package that will be discussed in more detail below.

Figure 1B:
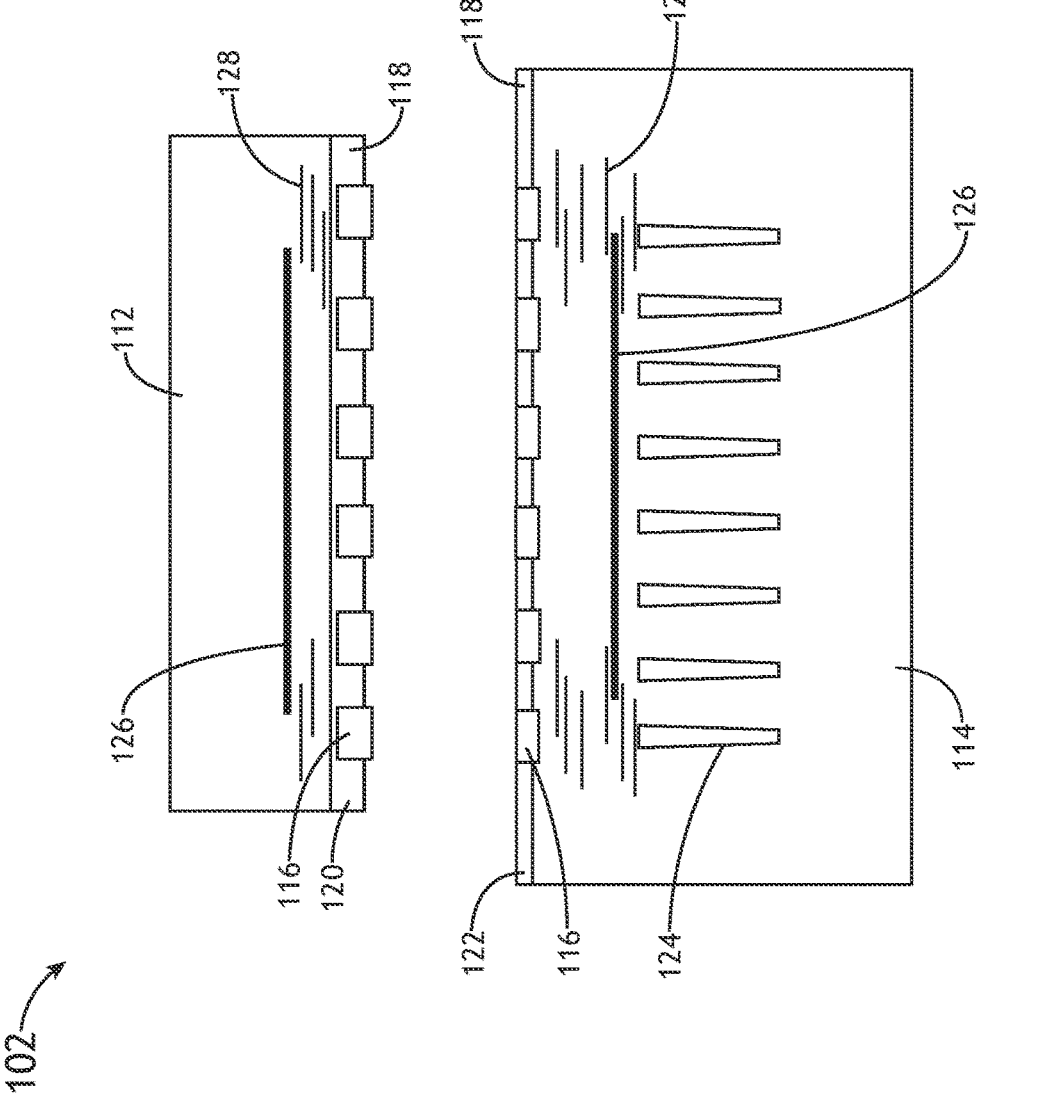
FIG. 1B shows a first step of the method for manufacturing a chip package in FIG. 1A.

Referring to FIG. 1B, a front cross-sectional view of the first step 102 of the method 100 is shown, in accordance with one or more embodiments of the present disclosure. The first step 102 may comprise providing one or more top dies 112 (e.g., chip, wafer, compute die, memory die, I/O die, or the like), one or more bottom dies 114 (e.g., chip, wafer, compute die, memory die, I/O die, or the like), two or more layers of copper pads 116 (e.g., active copper) and two or more dielectric layers 118. The copper pads 116 may refer to an exposed region which may be used to electrically and/or mechanically connect between dies. The copper pads 116 may also be referred to as a landing pad, a surface mount pad, a bonding pad, and the like. The term layer may refer to a layer of the dies which include both the copper pads 116 and the dielectric. For example, the die 112 may include a layer including the copper pads 116 and the dielectric layer 118. By way of another example, the die 114 may include a layer including the copper pads 116 and the dielectric layer 118. The copper pads 116 may then carry electrical signals or current between the dies. A first surface of each of the one or more top dies 112 is coupled to a first interconnecting layer 120, and a first surface of each of the one or more bottom dies 114 is coupled to a second interconnecting layer 122. The first and second interconnecting layers each comprise one or more layers of copper pads 116 and one or more dielectric layers 118.

In some embodiments, the top dies 112 or the bottom dies 114 of the method 100 may comprise Through-Silicon Vias (TSVs) 124 that provide power and signal conductivity 128 between components (e.g., between the top dies 112 and the bottom dies 114). The TSVs 124 are a type of via (vertical interconnect access) connection used in microchip manufacturing that partially or completely pass-through silicon dies to allow for stacking of dies (e.g., stacking of the bottom dies 112 and the top dies 114). The coupling by the TSVs 124 does not require direct connection between the vias and the components. For example, the TSVs 124 may connect to pads (e.g., the copper pads 116), or may have multiple vias interconnected through traces. The TSVs 124 allow for multiple layers of transistors 126 to be constructed separately. The TSVs 124 may provide the signal conductivity 128 (e.g., power or data connectivity) between the layers of transistors 126. For example, the TSVs 124 may enable some power and data connectivity to pass between the top dies 112 and the bottom dies 114. In another example, the TSVs 124 may enable some power and data connectivity to pass between a stack of the top dies 112 and/or the bottom dies 114.

Alternatively, or additionally, the top dies 112 or the bottom dies 114 of the method 100 may comprise other interconnectivity components (e.g., deep trench capacitors or integrated voltage regulators) that help regulate the signal conductivity 128 of the chip package being fabricated using method 100. Deep trench capacitors are semiconductor devices that are used to add capacitance to various integrated circuits within the chip package. For example, the deep trench capacitors may store electrostatic energy in an electric field and provide this energy to the integrated circuit components of the chip package (e.g., the transistors 126 of the top dies 112 and the bottom dies 114) when necessary. Integrated voltage regulators are semiconductor devices that may provide a constant fixed output voltage regardless of a change in load or input voltage to the various integrated circuit components (e.g., the transistors 126 of the top dies 112 and the bottom dies 114) of the chip package.

In some embodiments, the top dies 112 or the bottom dies 114 of the method 100 may be an active die or a passive die. Active dies may require a source of energy in order to perform their specific function and may comprise semiconductor devices (e.g., diodes, transistors 126, or integrated circuits) that can inject power into a circuit and are capable of electrically controlling and amplifying the flow of electrical current throughout the components of the chip package. Alternatively, passive dies may comprise components (e.g., resistors, capacitors, inductors, transducers) that can influence the flow of electricity running through them. For example, at least one of the top dies 112 may be a passive die. For example, a passive die may comprise deep trench capacitors providing additional consumption or storage of energy within the chip package and at least one of the bottom dies 114 may be an active die controlling the signal conductivity 128 (e.g., amplifying the flow of electrical current) of the chip package.

In some embodiments, the two or more dielectric layers 118 may be comprised of a stoichiometry of silicon and oxygen molecules. The dielectric layers may comprise silicon oxide (SiOx), where x is an integer. For example, the two or more dielectric layers 118 may be comprised of silicon dioxide (which, e.g., may be optimized for hybrid copper bonding due to its low coefficient of thermal expansion and high bonding energy). In embodiments, the dielectric layers 118 may include multiple dielectric sublayers. The dielectric sublayers may comprise the silicon oxide or a similar material.

Figure 1C:
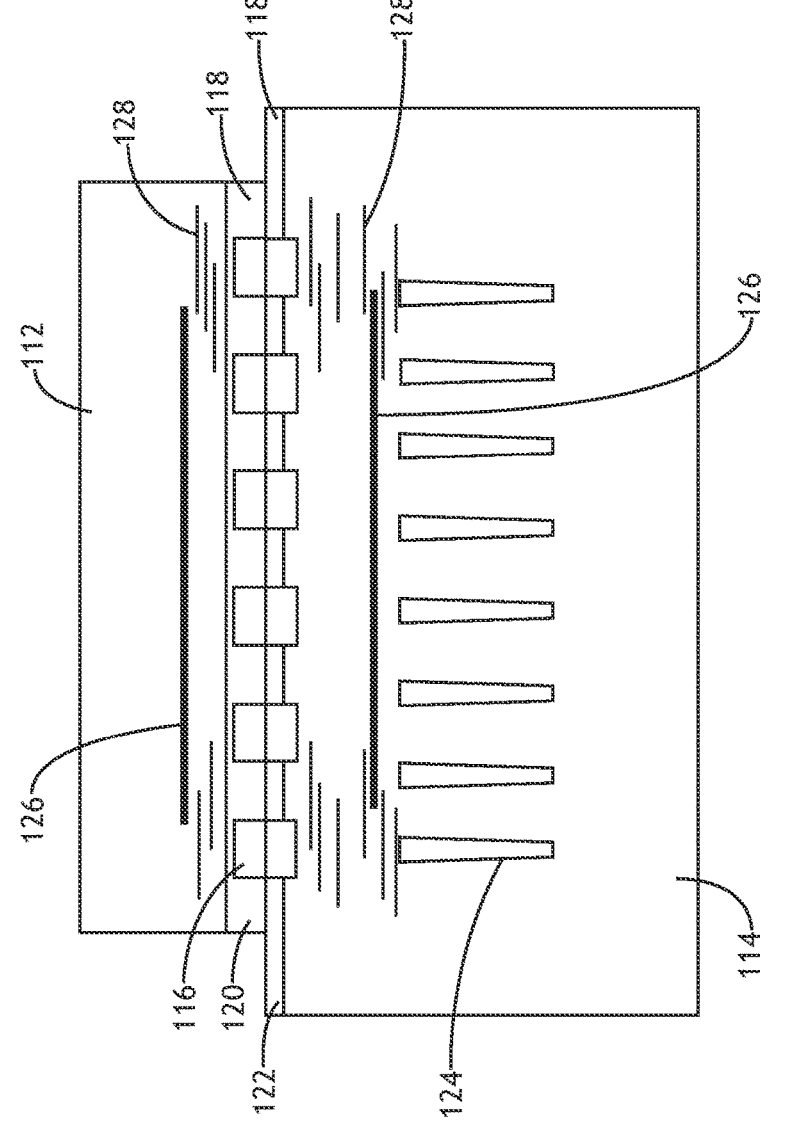
FIG. 1C shows a second step of the method for manufacturing a chip package in FIG. 1A, depicting a coupling process of a top die to a bottom die via hybrid copper bonding.

Referring to FIG. 1C, a front cross-sectional view of the second step 104 of the method 100 is shown, depicting a coupling process of the one or more top dies 112 and the one or more bottom dies 114 via hybrid copper bonding, in accordance with one or more embodiments of the present disclosure. The second step 104 may comprise: performing a coupling of the first and second interconnecting layers 120, 122 between the one or more top dies 112 and the one or more bottom dies 114 via hybrid copper bonding. The coupling may be a face-to-face coupling. The coupling may also be at an elevated temperature (e.g., ranging from 25 to 400° C.) and/or pressure (e.g., ranging from 50 to 150 MPa).

Hybrid copper bonding may include a bond that combines a dielectric bond with embedded copper metal to form interconnections. The interconnection may be used for coupling various components of a chip package (e.g., coupling the top dies 112 to the bottom dies 114). Hybrid copper bonding increases the density of interconnection pitches as compared to microbumps (40 microns scale to less than 10 microns) to connect the various components in the chip packages. An interconnection pitch may refer the center-to-center distance from one interconnect (e.g., one of the microbumps or one of the copper pads 116) to another interconnect. The higher the density of interconnection pitches may correspond to a decrease in the center-to-center distance between the interconnects. Hybrid copper bonding may comprise planarized dielectric layers (e.g., the dielectric layers 118) and embedded copper connection points (e.g., the copper pads 116). The dielectric layers 118 and the copper pads 116 may be bonded in the same plane in the bond interface to form the first and second interconnecting layers 120, 122. Bonding the dielectric layers 118 and the copper pads 116 in the same plane may allow for a face-to-face coupling between the top dies 112 and the bottom dies 114. Face-to-face coupling may refer to a coupling style in three-dimensional integrated circuits that bonds two or more stacked dies. For example, the top dies 112 and/or the bottom dies 114 may use the top-metal (face) as the coupling side when coupling the top dies 112 with the bottom dies 114. The transistors 126 of the top dies 112 and the bottom dies 114 may face each other when the top dies 112 are coupled face-to-face with the bottom dies 112. For example, the first and second interconnecting layers 120, 122 are simultaneously coupled together such that the dielectric layer 118 of the first interconnecting layer 120 is coupled to the dielectric layer 118 of the second interconnecting layer 122, creating a structure that essentially acts like one die. The bond may be an elevated temperature bond between two clean oxide surfaces (e.g., silicon dioxide). When the temperature is elevated, the layers of copper pads 116 expand more than the dielectric layers 118, causing each layer of copper pads 116 to couple to the other (e.g., at copper connection points), and create an automatic pressure bond.

Figure 1D:
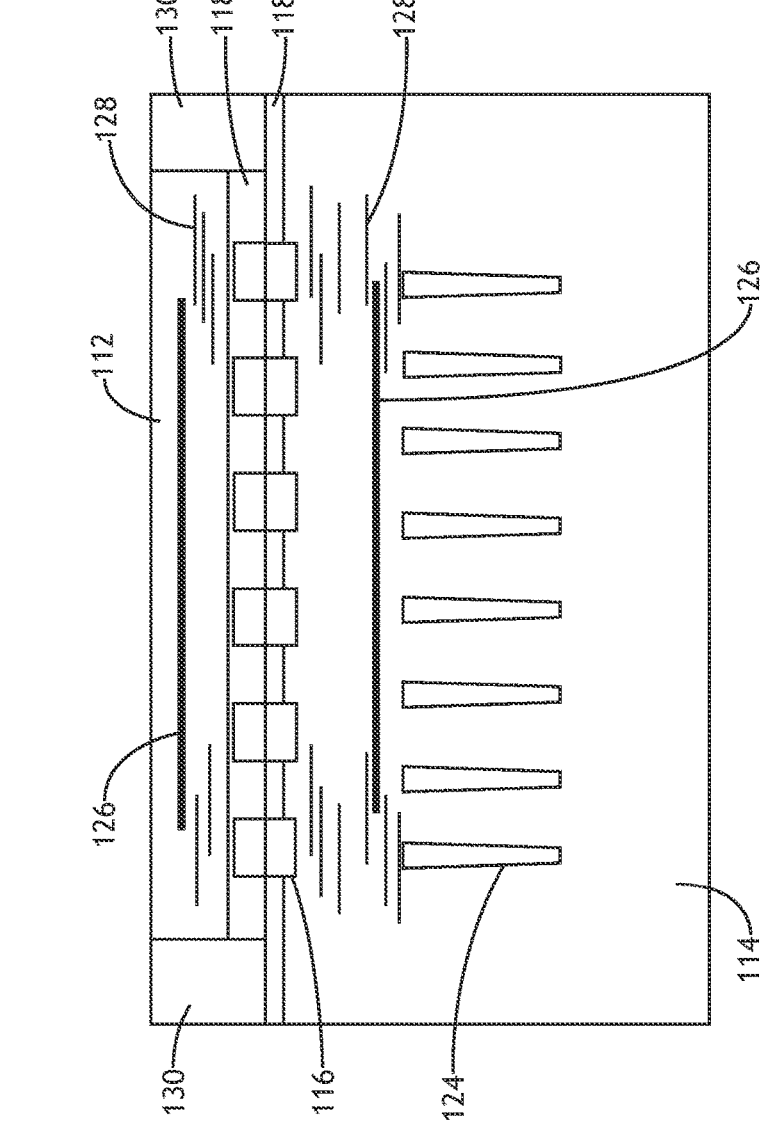
FIG. 1D shows a third step of the method for manufacturing a chip package in FIG. 1A, depicting a thinning down of a top die and a material.

Referring to FIG. 1D, a front cross-sectional view of the third step 106 is shown, depicting a thinning (e.g., reducing, refining, featuring) of the one or more top dies 112 and a material 130, in accordance with one or more embodiments of the present disclosure. The third step 106 may comprise: depositing the material 130. The material 130 may be deposited to at least partially cover the interconnecting layer 122 and/or at least partially cover the die 114. Partially covering may refer to placing the material above the surface of the interconnecting layer 122 and/or the die 114 and is not limited to covering the entire surface of the interconnecting layer 122 and/or the die 114. The material 130 may be deposited such that the material 130 is at or above a height of the one or more dies 112. Where the one or more top dies 112 includes at least two top dies, the material may also fill one or more gaps between the at least two top dies (see FIG. 1G for example). The material 130 may be deposited in one or more steps. The material 130 may also comprise multiple materials. A second surface of the one or more top dies 112 and the material 130 may then be thinned to define a continuous surface. The continuous surface may be bounded by an outer perimeter of the one or more top die 112 and the material. The continuous surface may refer to a substantially flat, smooth, even, or planar surface defined by the one or more top die 112 and the material 130. The continuous surface may be horizontal or nearly so without significant curvature or inclination and without noteworthy elevations or depression. For example, the second surface of the one or more top dies 112 and the material 130 may be thinned to an equivalent height during the third step 106. In some embodiments, the thinning of the one or more top dies 112 and the material 130 may be similar to a chemical-mechanical polishing (CMP) process that inserts fills to make metal density uniform and reduce post-thinning height variations. In some embodiments, the thinning may be accomplished by a mechanical grinding. For example, the mechanical grinding may utilize a diamond and resin bonded grind wheel mounted on a high-speed spindle to accomplish the thinning. In other embodiments, the thinning may be accomplished by wet etching. For example, wet etching may utilize liquid etchants that diffuse onto the surface of the dies to accomplish the thinning. In other embodiments, the thinning may be accomplished by dry chemical etching (DCE). For example, atmospheric downstream plasma etching (ADP) is a type of DCE that may utilize a reactive process gas to roughen (e.g., thin) the surface of the dies.

In some embodiments, the material 130 may comprise stoichiometries of molecules such as silicon and oxygen molecules; silicon, oxygen, and nitrogen molecules; and/or silicon, carbon and nitrogen molecules (e.g., silicon oxide, oxynitride, or oxycyanide). The material 130 may provide structural support during the method 100 of fabricating the chip package as well as additional heat transfer capabilities based on the molecular composition of the material 130. Below is a table comparing the mechanical and functional performance of various carbon-based epoxy composites that may be utilized in the material 130 to enhance the structural support and/or heat transfer capabilities of the invention. Further, the epoxy composites shown in the table below may also be utilized in a bonding film discussed later herein.

| Comparison of mechanical and functional performance of various carbon-based epoxy composites | | | | | | | |
|---|---|---|---|---|---|---|---|
| Materials | Filter type | Tensile strength (MPa) | Young's moduli (GPa) | K1C (MPa · m$^{0.5}$) | G1C (J · m$^{-2}$) | Shear strength (MPa) | Electrical conductivity (S/cm) | Thermal conductivity (W/mK) |
| Epoxy composites | SWCNT (1 wt %) | 10.5-74.1 | 0.503-3.27 | 0.58 | | | 7 x 10 − 9 | |
| | MWCNT (1 wt %) | 46.4-50 | 1.59-2.83 | 2.8 | 270 | | | 0.25-0.38 |
| | TR-GO | | | | | | ~10 − 9 | 0.254 |
| | R-GO (0.05 wt %) | 53 | 3.0 | 0.48 | 77 | | 1.68 × 10 − 10 | |
| | GO (0.5 wt %) | 56 | 3.0 | 0.75 | 250 | — | — | |

9    10

-continued

Comparison of mechanical and functional performance of various carbon-based epoxy composites

| Materials | Filter type | Tensile strength (MPa) | Young's moduli (GPa) | K1C (MPa · m^0.5) | G1C (J · m^-2) | Shear strength (MPa) | Electrical conductivity (S/cm) | Thermal conductivity (W/mK) |
|---|---|---|---|---|---|---|---|---|
| | GnPs (1 wt %) | 18.2-62 | 2.23-3.0 | 0.95 | 298 | | | |
| | m-GnPs (1 wt %) | 59-63.98 | 2.8 | 0.75 | 245 | | ~10 – 9 | 0.284 |
| | m-GnPs (0.489% vol %) | 49.21 | 3.412 | 1.258 | 557 | | 3 × 10 – 9 | |
| Epoxy composite | SWCNT (1 wt %) | | | | | 10 | ~10 – 4 | |
| adhesives | MWCNT (1 wt %) | | 0.68 | | | ~15 | | |
| | CNP (0.5 wt %) | | | | ~96 | 9.2 | — | — |
| | CNT (0.25 wt %) | | | — | ~105 | 9.2 | | |
| | GO (1 wt %) | 58.98 | 3.025 | | — | 6.36 | 7.4 × 10 – 16 | 0.37 |
| | R-GO (1 wt %) | 51.31 | 2.894 | | | 5.174 | 2.6 × 10 – 14 | 0.53 |
| | m-GnPs (6 wt %) | 53 | 3.4 | | | 8.9 | | |
| | GnPs (1 wt %) | | | | | ~7.5 | | ~0.2 |
| | GnPs (0.5 vol %)[a] | 35 | 2.64 | 1.68 | 856 | 12.34 | 4 × 10 – 9 | 0.24 |

[a] 0.5 vol % GnPs is equivalent to 1 wt % GnPs.

Qinoshi Meg, Sensen Han, Sherif Araby, Yu Zhao, Zhiwen Liu & Shaowei Lu (2019) Mechanically robust, electrically and thermally conductive graphene-based epoxy adhesives, Journal of Adhesion Science and Technology, 33:12, 1337-1356. DOI: 10:1080101694243.2019, 1596890

Figure 1E:
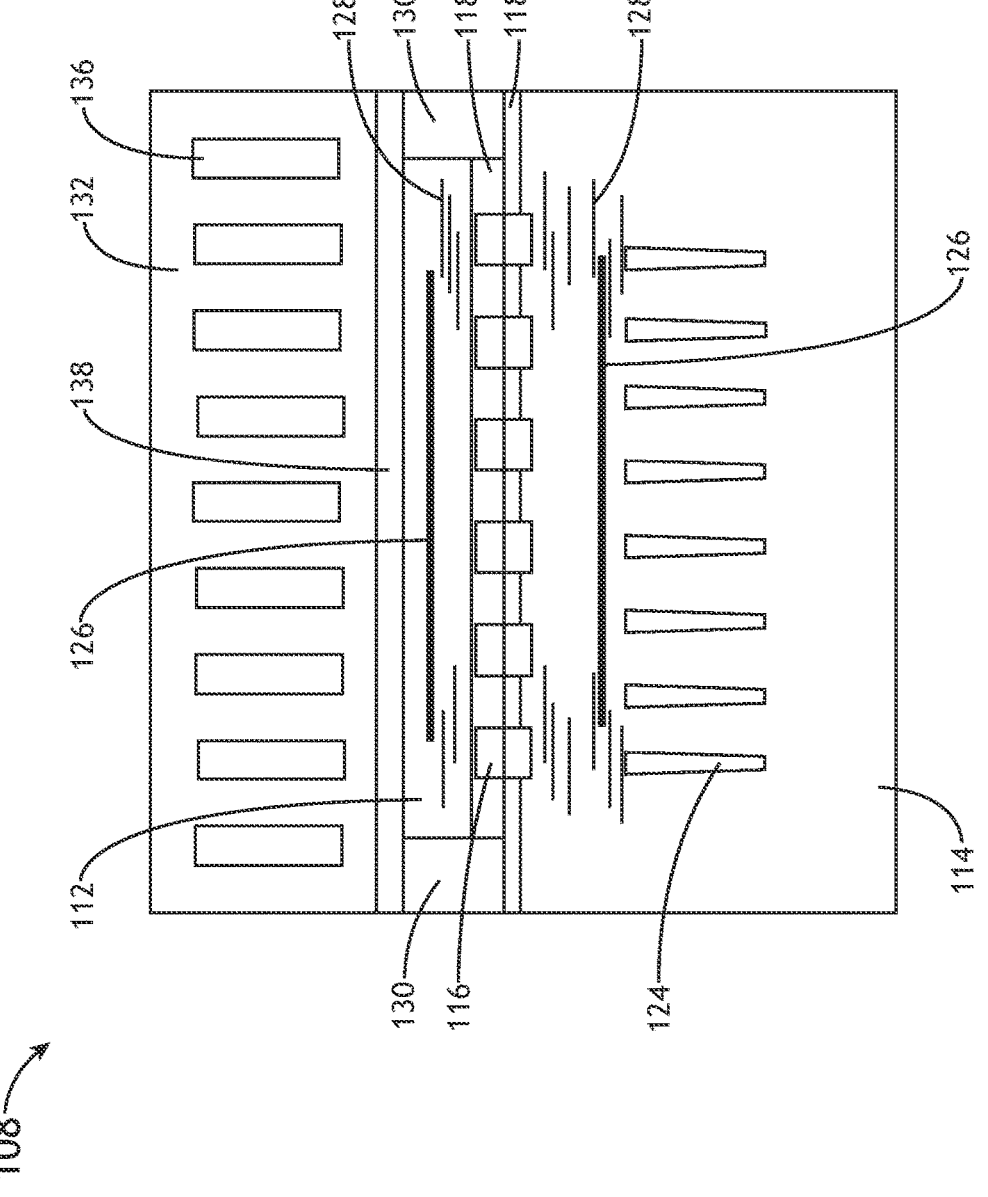
FIG. 1E shows a fourth step of the method for manufacturing a chip package in FIG. 1A, depicting a coupling of a support die to a top die.

Referring to FIG. 1E, a front cross-sectional view of the fourth step 108 is shown, depicting a coupling of a support die 132 to the one or more top dies 112, in accordance with one or more embodiments of the present disclosure. The fourth step 108 may comprise: coupling a first surface of the support die 132 to the second surface of at least one of the one or more top dies 112. In some embodiments, the support die 132 (may be temporarily coupled or bonded) to the one or more top dies 112. In some embodiments, the support die 132 may comprise aluminum nitride, silicon, and/or similar silicon-based compositions (e.g., graphene on silicon or diamond on silicon). In some embodiments, the support die 132 may be a bulk silicon. In some embodiments, a backside of the support die 132 may comprise a bare silicon or a backside metallization. The backside of the support die 132 may enhance the thermal efficiency of the support die 132 and/or further support the thermal conductivity of the chip package. For example, depositing metal layers on the support die 132 may allow for further conductive pathways to be formed between the support die 132 and another semiconductor device.

Figure 4:
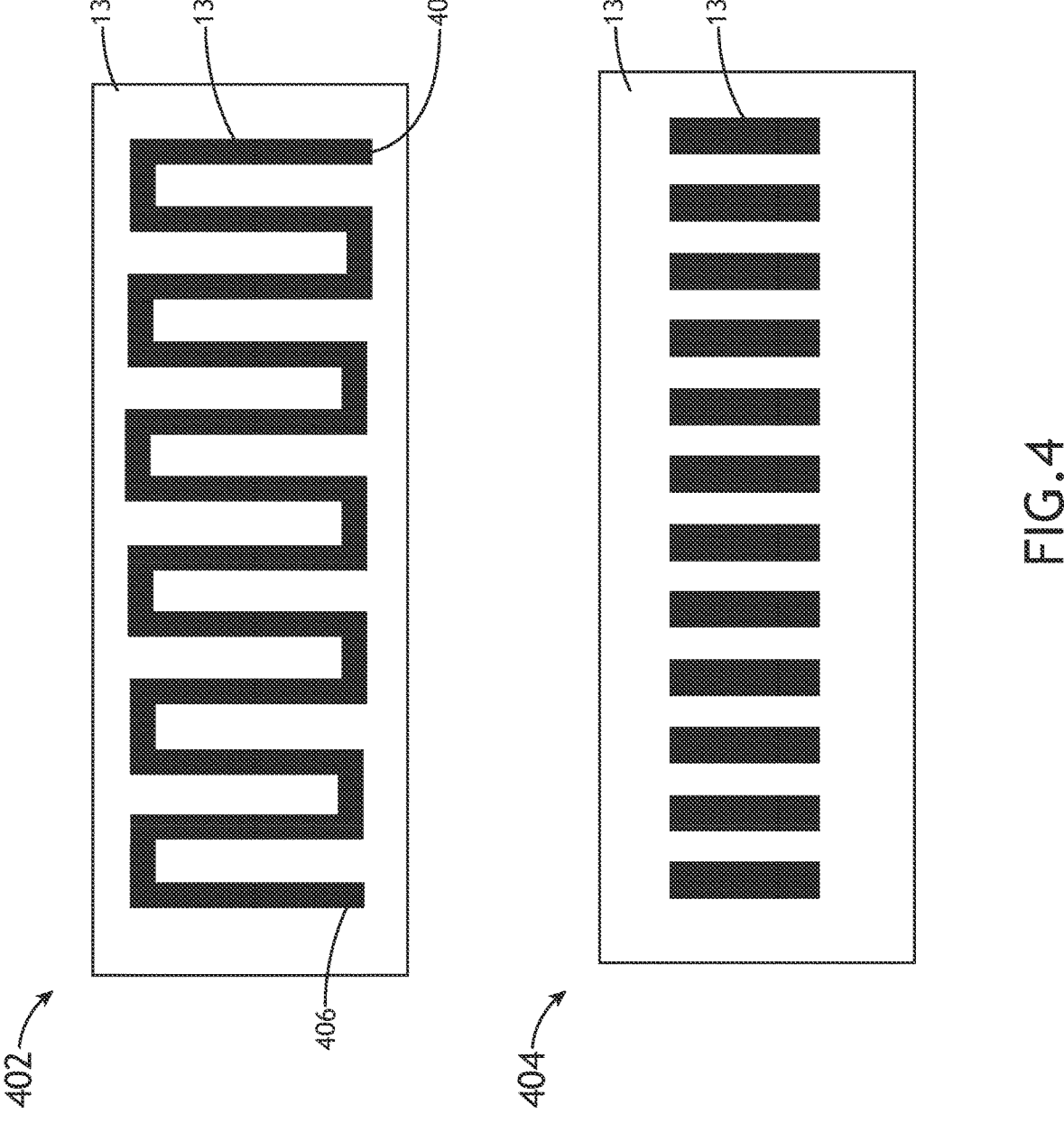
FIG. 4 shows a top and side cross-sectional view of a support die constructed with microfluidic channels.

In some embodiments, as shown in more detail in FIG. 4, the support die 132 may comprise one or more microfluidic channels 136. The support die 132 may be used more efficiently by utilizing its interior and incorporating the microfluidic channels 136. The microfluidic channels 136 may improve the thermal heat transfer within the chip package. For example, the microfluidic channels 136 may be filled with fluidic material (e.g., dielectric fluid, e.g. fluorocarbons, mineral oil, hydrocarbon, 3M™ Fluorinert™, 3M™ Novec™ or the like). Materials such as these may provide for a liquid-cooling heat transferring process within the chip package while the support die 132 is simultaneously providing passive heat transfer through the regions of its interior that do not interact with the microfluidic channels 136.

In some embodiments, the support die 132 may be bonded to the second surface of the top dies 112 via a bonding film 138. In some embodiments, the bonding film 138 may comprise a filler material and a resin material. For example, the filler material may fill the internal body of the bonding film 138 while the resin material may act as an adhesive that covers the external body of the bonding film 138 and makes direct contact with the one or more top dies 112 and the support die 132 during the fourth step 108 of the method 100. In some embodiments, the filler material may comprise silver, aluminum, and/or copper-related compositions (e.g., silver, aluminum flakes, silver coated copper spheres, silver-diamond, or copper-diamond particles). In some embodiments, the resin material may comprise various polymers (e.g., polyimide, benzocyclobutane, epoxy, phenolic, polyurethane, or silicon).

In some embodiments, the bonding film 138 may comprise a dielectric material. For example, the bonding film 138 may comprise a dielectric material. In some embodiments, the dielectric material may comprise different stoichiometries of molecules such as silicon and oxygen molecules; silicon, oxygen, and nitrogen molecules; and/or silicon, carbon and nitrogen molecules (e.g., silicon oxide, oxynitride, or oxycyanide). For example, the dielectric material may adhere (e.g., bond) the one or more top dies 112 to the support die 132. The dielectric material may also improve the thermal conductivity of the chip package based on the selected composition for the dielectric material.

The bonding film 138 may be an important component to the chip package for various reasons. For example, the bonding film 138 may conduct thermal heat throughout the fabricated chip package. The resin material may be selected for its ability to extract heat from the interfaces between the bonding film 138 and the one or more top dies 112, the support die 132, and the filler material. Additionally, the filler material may further enhance the thermal conductivity of the bonding film 138 based on the selected composition of the filter material. Additionally, the microfluidic channels 136 constructed inside of the support die 132 may also conduct the thermal heat by acting as a heat sink.

Using the bonding film 138 to bond the one or more top dies 112 to the support die 132 may provide for additional structural support within the structure of the chip package. For example, the top dies 112 and the bottom dies 114 may be very thin (e.g., several microns). Therefore, the support die 132 may provide extra mechanical robustness and support to the fabricated chip package derived from the method 100.

Figure 1F:
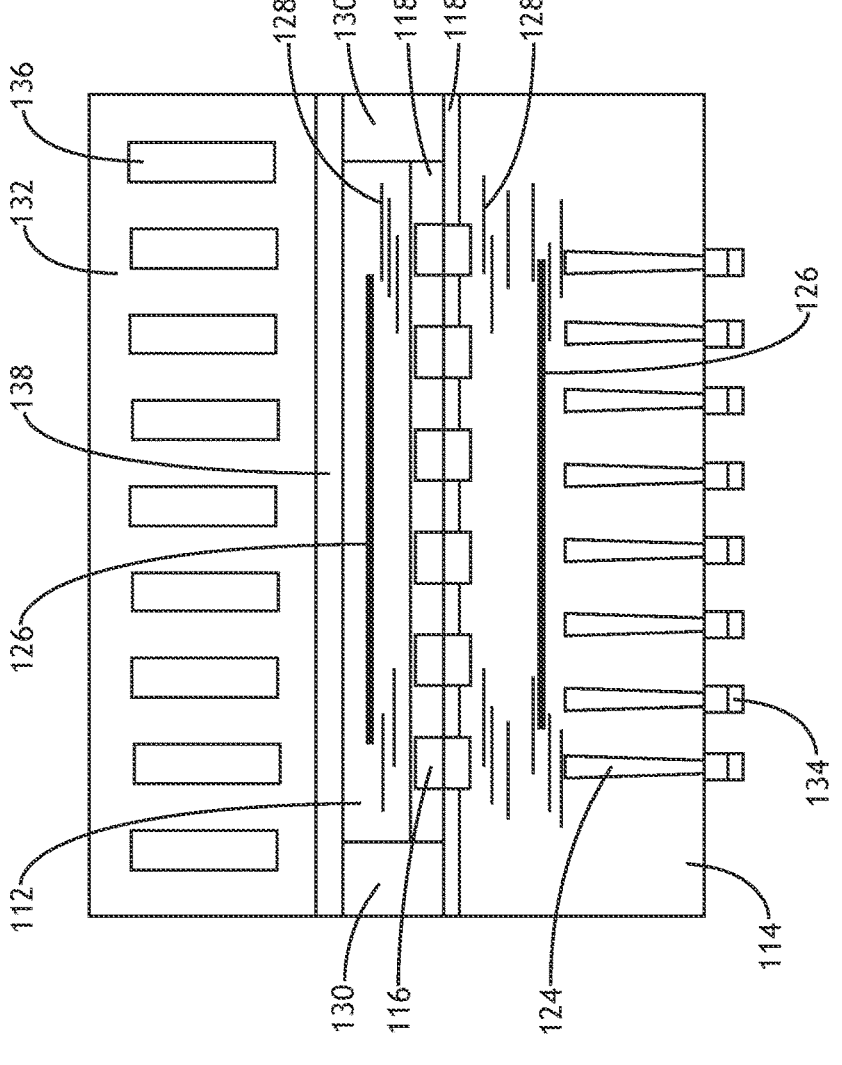
FIG. 1F shows a fifth step of the method for manufacturing a chip package in FIG. 1A, depicting a thinning down of the bottom die.

Referring to FIG. 1F, a front cross-sectional view of the fifth step 110 is shown, depicting a thinning of the one or more bottom dies 114, in accordance with one or more embodiments of the present disclosure. The fifth step 110 may comprise: thinning a second surface of the one or more bottom dies 114. The second surface of the one or more bottom dies 114 may then be coupled to a plurality of microbumps 134. The thinning may occur by any of the techniques previously described herein.

In some embodiments, the one or more bottom dies 114 may comprise the TSVs 124. For example, in the fifth step 110, the one or more bottom dies 114 (e.g., with the TSVs 124) may be thinned out until the TSVs 124 are revealed and the plurality of microbumps 134 (e.g., solder microbumps) may then be coupled to the second surface of the one or more bottom dies 114 (e.g., the microbumps 134 connecting to the TSVs 124). The plurality of microbumps 134, as opposed to the hybrid copper bonding used to couple the one or more dies 112, 114 within the chip package, may be used to couple the chip package to an external component of a semiconductor package. For example, the plurality of microbumps 134 may comprise solder bumps that provides a coupling point between the chip packages and an interposer. The interposer is an electrical interface that may be used to allow electrical signals to pass through it to another component (e.g., another chip package). For example, connecting the chip package comprising a stack of one or more of the top dies 112 and one of the bottom dies 114 (that comprises the TSVs 124) to the interposer may be accomplished by coupling the microbumps 134 to the interposer which may provide the signal conductivity 128 between the chip package and the interposer. Further embodiments of the chip package being coupled to an interposer via the microbumps 134 will be discussed in more detail below.

Figure 1G:
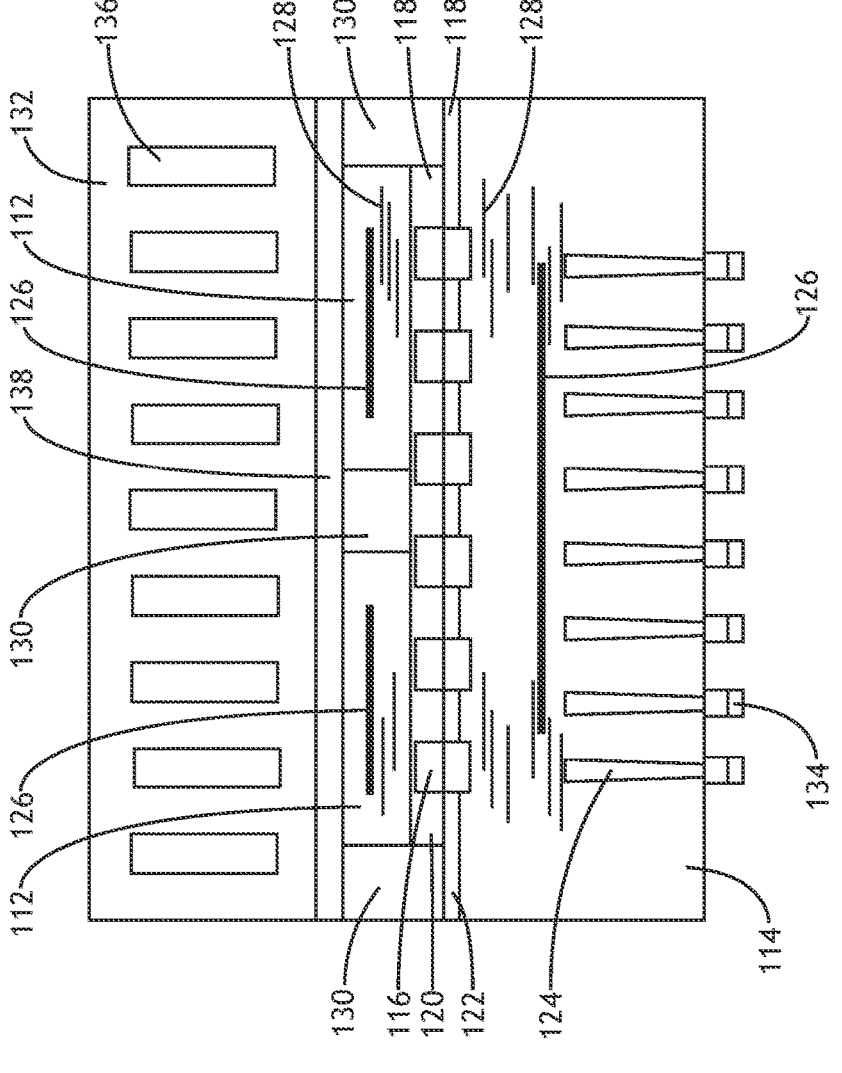
FIG. 1G and FIG. 1H show alternative embodiments of the method for manufacturing a chip package in FIG. 1A.

Referring to FIG. 1G, an alternative embodiment of the method 100 is shown, depicting a front cross-sectional view of an end product 140 produced from the method 100, in accordance with one or more embodiments of the present disclosure. In some embodiments, the end product 140 may be configured with two or more of the one or more top dies 112 and one or more of the one or more bottom dies 114. For example, in some embodiments, the method 100 may be configured to fabricate the end product 140 with two of the one or more top dies 112 and one of the one or more bottom dies 114. For example, the two top dies 112 during the second step 104 may be face-to-face coupled on a same planarized surface (e.g., the first interconnecting layer 120) via hybrid copper bonding to the one bottom die 114. For example, during the second step 104 discussed previously herein, the two top dies 112 may be coupled to the dielectric layer 118 of the first interconnecting layer 120 and during the third step 106, the material 130 may be deposited onto the one or more gaps between the two top dies 112. In some embodiments, the support die 132 of the end product 140 may comprise the microfluidic channels 136 or the bonding film 138 to support the increased power density created by having more than one of the top dies 112 in comparison to having only one of the top dies 112 (e.g., as seen in FIG. 1F). In some embodiments, the end product 140 may be configured with only one of the top dies 112 and one of the bottom dies 114 (e.g., as seen in FIG. 1F).

Figure 1H:
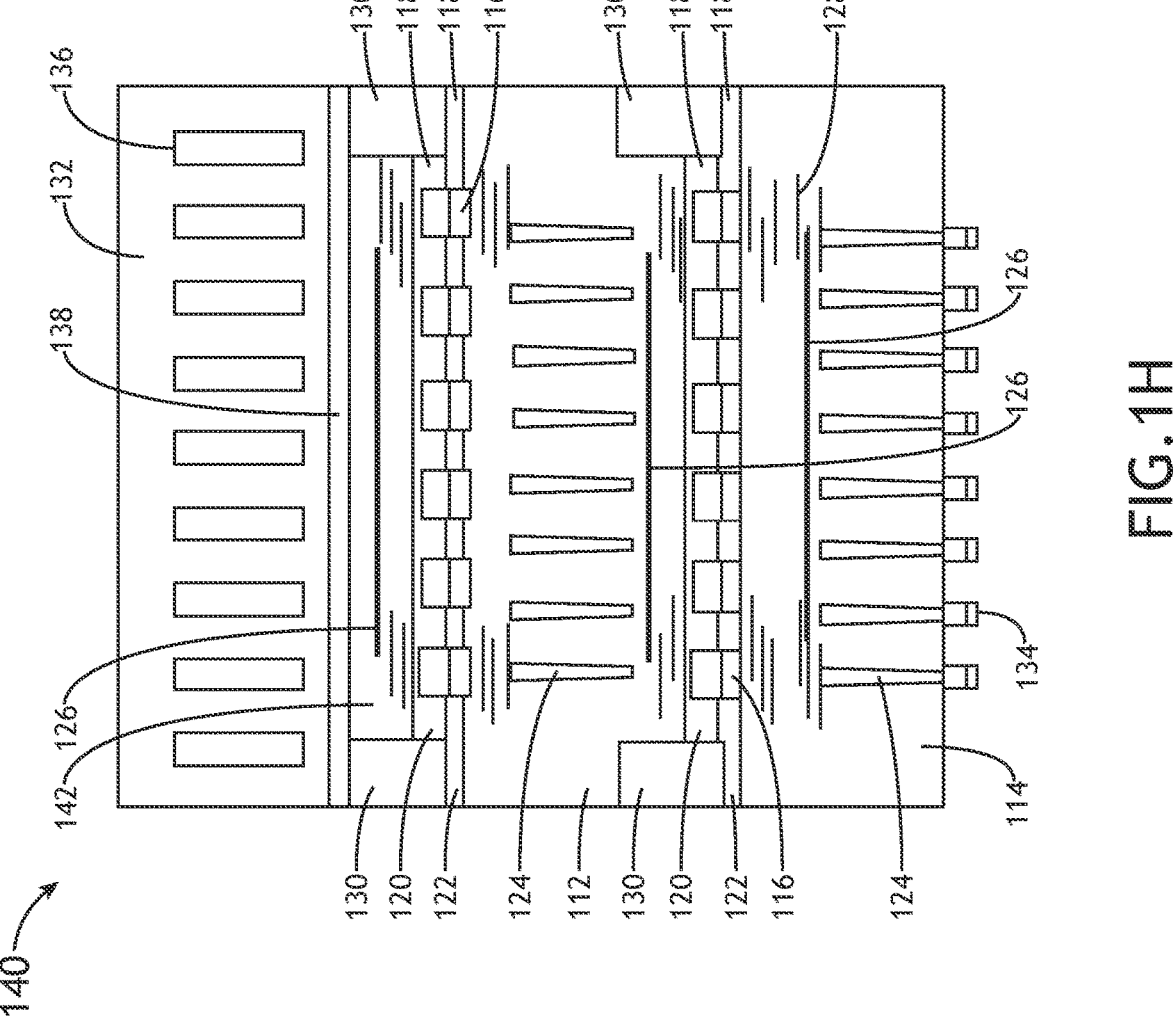

Referring to FIG. 1H, an alternative embodiment of the method 100 is shown, depicting a front cross-sectional view of an end product 140 with additional top dies 142 (e.g., of the one or more top dies 112) coupled to the one or more top dies 112 in a stacked configuration, in accordance with one or more embodiments of the present disclosure. In some embodiments, as seen in FIG. 1H, the method 100 may be further configured to fabricate a stacked chip package that comprises one or more additional top dies coupled to the one or more top dies 112 via hybrid copper bonding. For example, the third step 106 (e.g., as seen in FIG. 1D) may further comprise coupling a first surface of the one or more additional top dies 142 to the thinned second surface of the one or more top dies 112 via hybrid copper bonding. For example, after the thinning of the second surface of the one or more top dies 112, as seen in the third step 106, one of the additional top dies 142 may be coupled to the thinned second surface of the one or more top dies 112 via the first step 102, the second step 104, and the third step 106. For example, as seen in the first step 102 and the second step 104, a face-to-face coupling via hybrid copper bonding may be performed between the one or more top dies 112 and the one of the additional top dies 142. As seen in the third step 106, the material 130 may then be deposited and a thinning of the second surface of the additional top die 142 may then occur. The material 130 may be deposited to at least partially cover the additional top die 142. At that point, another additional top die 142 (not shown) may then be coupled to the thinned second surface of the previous additional top die 142 via the first step 102, the second step 104, and the third step 106. Any number of additional top dies 142 may be coupled to the one or more top dies 112 (e.g., in a stacked configuration). After the coupling of the one or more additional top dies 142 to the one or more top dies 112, a second surface of an additional top die 142 that is not in contact with another additional top die 142 may then be coupled to the first surface of the support die 132 (e.g., via the fourth step 108). In a preferred embodiment, the additional top die 142 with the highest density in the stacked chip package configuration is the additional top die 142 that is coupled to the support die 132. The second surface of at least one of the one or more bottom dies 114 may then be thinned and coupled to a plurality of microbumps 134 (e.g., via the fifth step 110).

The stacked chip package contemplated herein may comprise any number of additional top dies 142. Stacking three or more dies (e.g., a bottom die 114, a top die 112, and one or more additional top dies 142) increases the power density of the chip package and may require additional components to support the structure and the transferring of heat throughout the chip package. For example, a chip package including any number of top dies 112, 142 may further include the support die 132 with microfluidic channels 136 bonded to the one or more top dies 112, 142 via the bonding film 138. The support die 132 with the microfluidic channels may extract heat throughout the stacked chip package with the higher power density while also providing further mechanical support. Further, each of the one or more bottom dies 114 and the one or more top dies 112, 142 may comprise the TSVs 124. The bottom dies 114 and the top dies 112, 142 with the TSVs 124 may provide for the signal conductivity 128 between the multiple layers of transistors 126 within the stacked chip package. Alternatively, or additionally, the additional top dies 142 of the method 100 may comprise other interconnectivity components (e.g., deep trench capacitors or integrated voltage regulators) that help regulate the signal conductivity 128 of the end product 140 fabricated using method 100. Applicant notes that the features and capabilities of the top dies 112 described herein should be interpreted to extend to the one or more additional top dies 142.

Figure 2A:
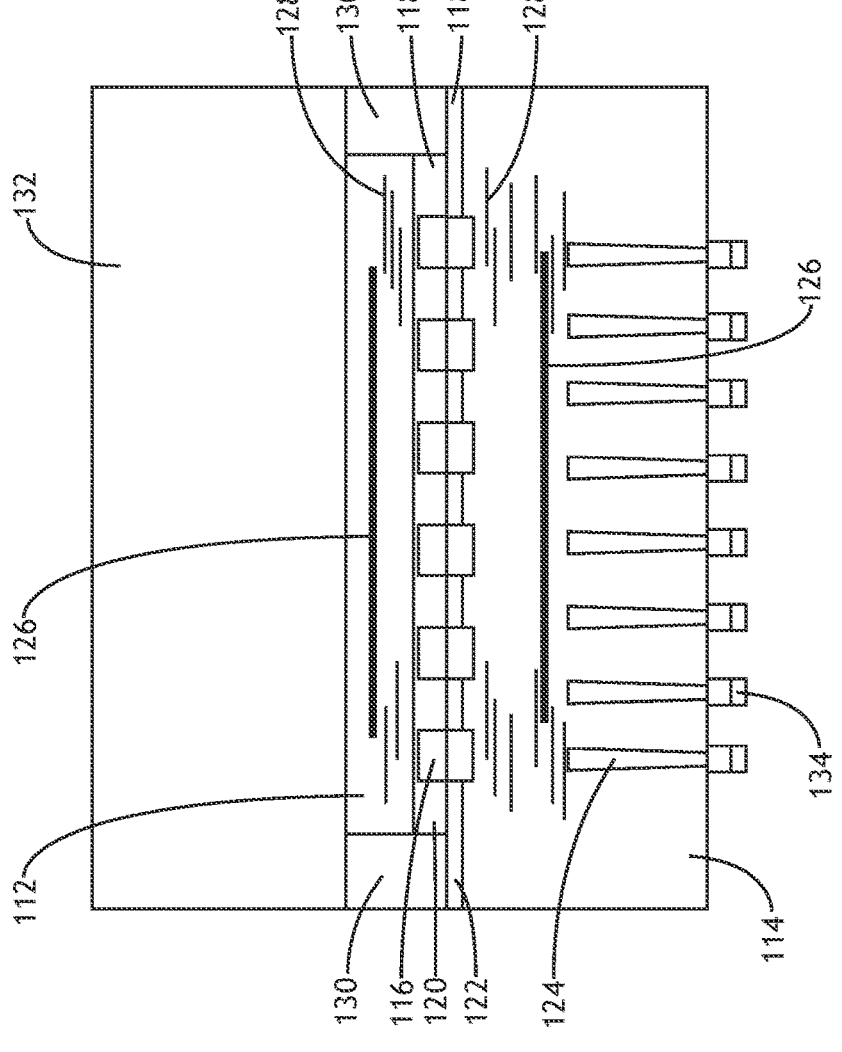
FIG. 2A shows a front cross-sectional view of a chip package.

Referring to FIG. 2A, a front cross-sectional view of a chip package 200 is shown, in accordance with one or more embodiments of the present disclosure. The applicant notes that the chip package 200 may be an end product 140 of the method 100 described previously herein. The embodiments and enabling components in the context of the method 100 for manufacturing the end product 140 should be interpreted to extend to the chip package 200. It is further noted, however, that the chip package 200 is not limited to the architecture of the method 100 or the end product 140.

In some embodiments, the chip package 200 may comprise one of the one or more top dies 112 coupled face-to-face to one of the one or more bottom dies 114 via hybrid copper bonding (by coupling the first interconnecting layer 120 and the second interconnecting layer 122 as shown in FIG. 1C). The first and second interconnecting layers 120, 122 may each comprise: one of the two or more layers of copper pads 116 and one of the two or more dielectric layers 118. The chip package 200 may further comprise the material 130 used to fill the gaps created by the coupling of the one or more top dies 112 and the one or more bottom dies 114, the support die 132 coupled to the one or more top dies 112, and the plurality of microbumps 134 coupled to the one or more bottom dies 114.

In some embodiments, the top dies 112 or the bottom dies 114 of the chip package 200 may comprise the TSVs 124. The TSVs 124 may provide power and signal conductivity 128 between components (e.g., between the bottom dies 114, the top dies 112, and the additional top dies 112). For example, the chip package 200 may comprise the TSV's 124 that are exposed from the second surface of the one or more bottom dies 114 and coupled to the plurality of microbumps 134. Alternatively, or additionally, the top dies 112 or the bottom dies 114 may comprise other interconnectivity components (e.g., deep trench capacitors or integrated voltage regulators) that help regulate the signal conductivity 128 of the chip package 200. In some embodiments, the top dies 112 or the bottom dies 114 may be an active die or a passive die. For example, at least one of the top dies 112 may be a passive die that provides additional consumption or storage of energy within the chip package 200 and at least one of the bottom dies 114 may be an active die controlling the signal conductivity 128 of the chip package 200.

Figure 2B:
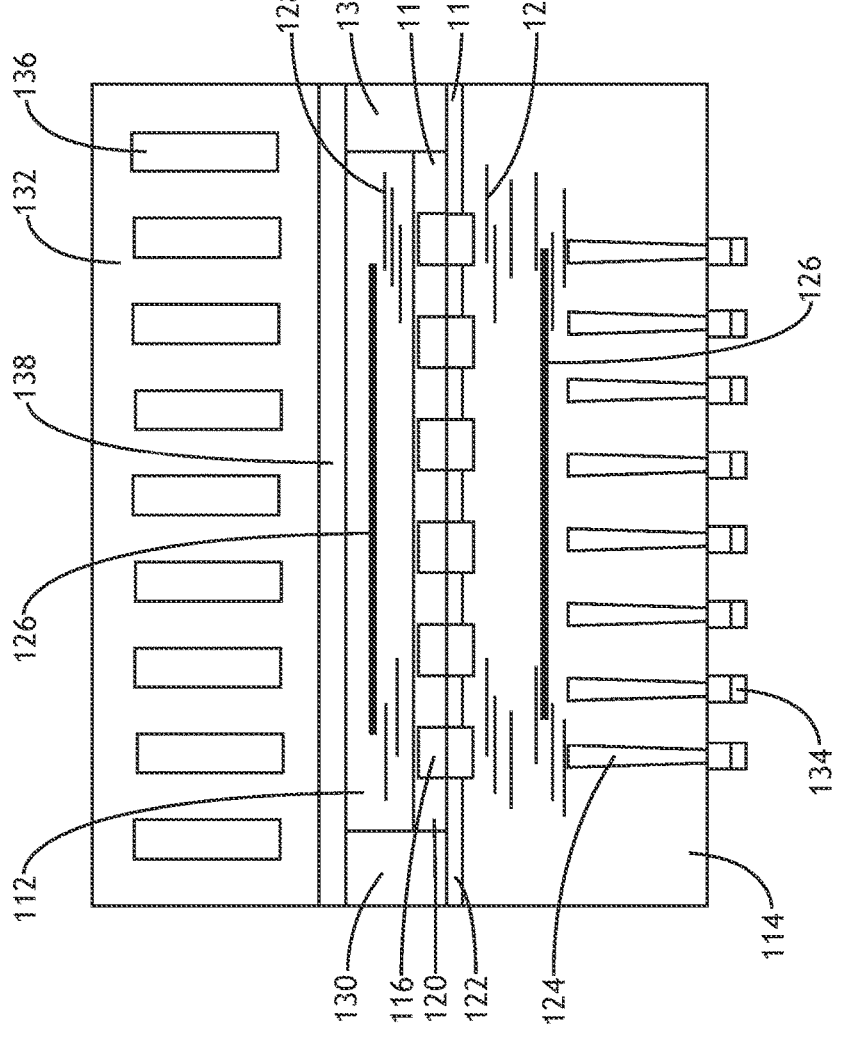
FIG. 2B to FIG. 2D show alternative embodiments of the chip package in FIG. 2A.

Referring to FIG. 2B, an alternative embodiment of the chip package 200 is shown, in accordance with one or more embodiments of the present disclosure. In some embodiments, the support die 132 may comprise the one or more microfluidic channels 136. The microfluidic channels 136 may improve the thermal heat transfer within the chip package 200. For example, the microfluidic channels 136 may be filled with fluidic material (e.g., dielectric fluid). The fluidic material may provide for a liquid-cooling heat transferring process within the chip package 200 while the support die 132 is simultaneously providing passive heat transfer through the regions of its interior that do not interact with the microfluidic channels 136.

In some embodiments, the support die 132 may be bonded to the second surface of the top die 112 via the bonding film 138. In some embodiments, the bonding film 138 may comprise the filler material and the resin material. For example, the filler material may fill the internal body of the bonding film 138 while the resin material may act as an adhesive that covers the external body of the bonding film 138 and makes direct contact with the one or more top dies 112 and the support die 132.

In some embodiments, the bonding film 138 may comprise the dielectric material. For example, the bonding film 138 may comprise a dielectric material entirely. For example, the dielectric material may adhere (e.g., bond) the one or more top dies 112 to the support die 132 and may also improve the thermal conductivity of the chip package based on the selected composition for the dielectric material.

Figure 2C:
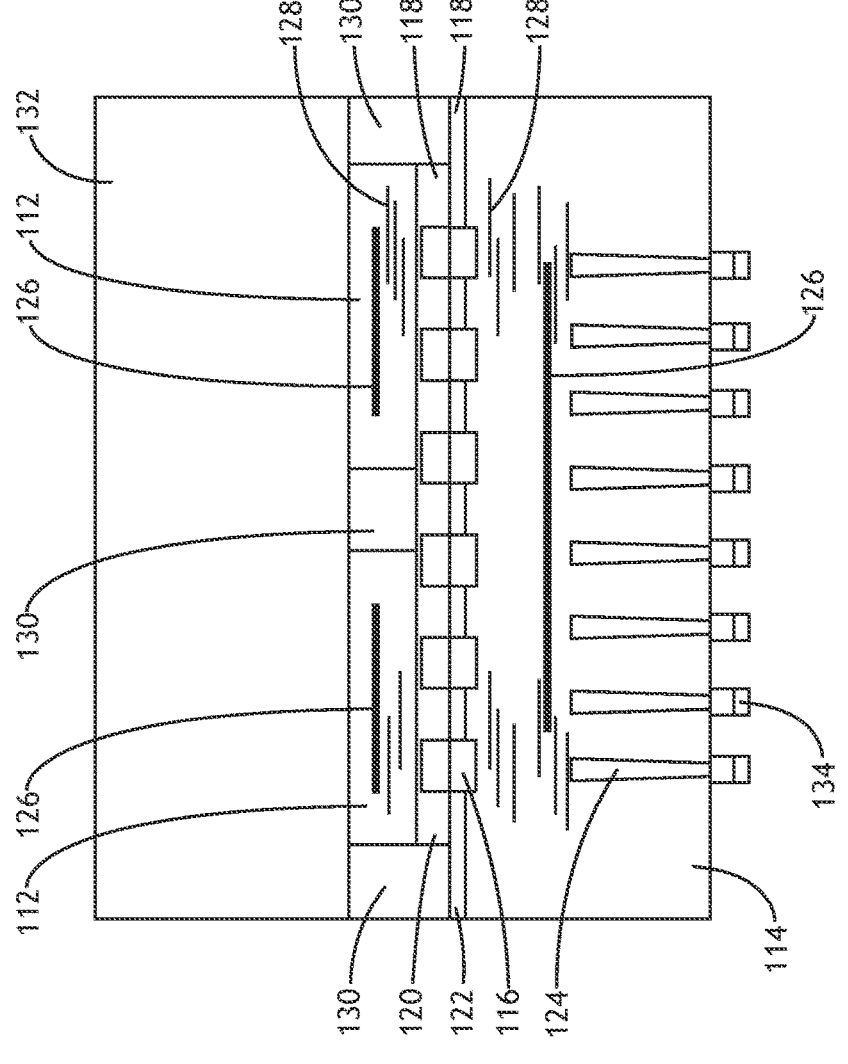

Referring to FIG. 2C, an alternative embodiment of the chip package 200 is shown, in accordance with one or more embodiments of the present disclosure. In some embodiments, the chip package 200 may comprise two of the one or more top dies 112 and one of the one or more bottom dies 114. For example, the two top dies 112 may be coupled to the same planarized surface (e.g., the first interconnecting layer 120) and may be face-to-face coupled to the one bottom die 114 via hybrid copper bonding. For example, as shown in FIG. 2C, the two top dies 112 may be coupled to the dielectric layer 118 of the first interconnecting layer 120 and the one bottom die 114 may be coupled to the second interconnecting layer 122, wherein the first and second interconnecting layer 120, 122 may be coupled via hybrid copper bonding and the material 130 may be deposited onto the one or more gaps between the two top dies 112.

Figure 2D:
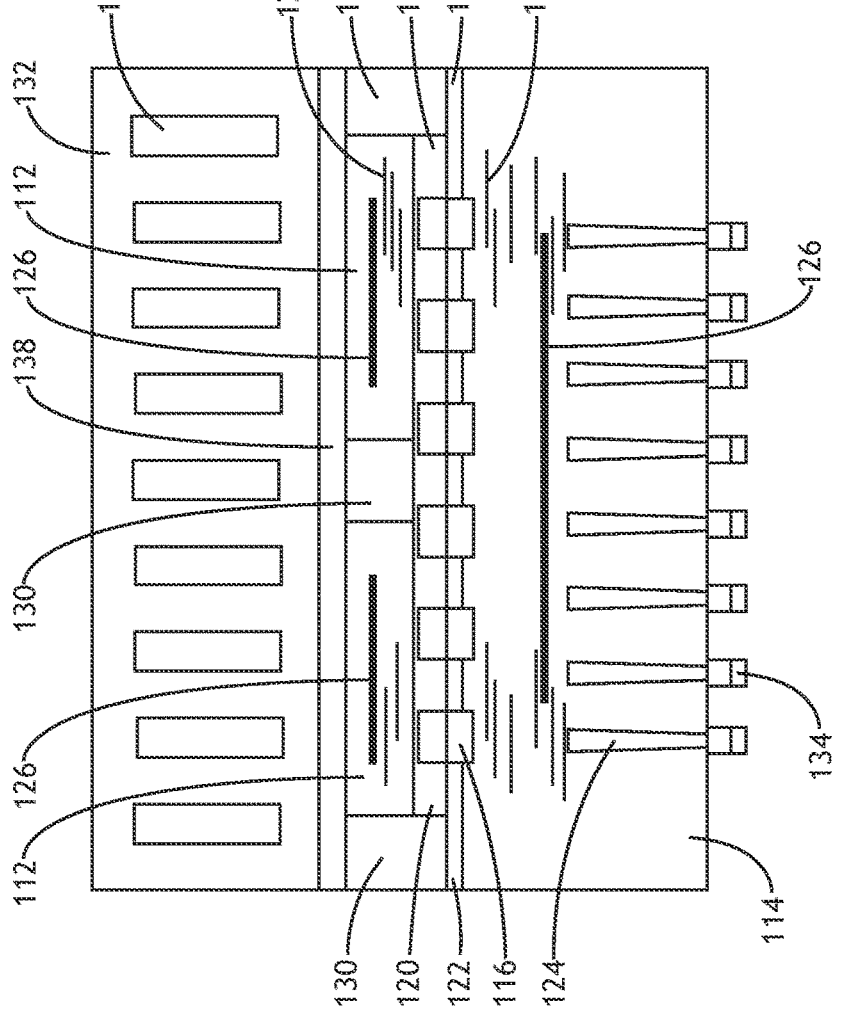

Referring to FIG. 2D, an alternative embodiment of the chip package 200 is shown, in accordance with one or more embodiments of the present disclosure. In some embodiments, the support die 132 may comprise the microfluidic channels 136 and/or the bonding film 138 to support the increased power density created by having more than one of the top dies 112 in comparison to having only one of the top dies 112 as shown in FIG. 2B.

In some embodiments, the chip package 200 may comprise two or more top dies 112, 142 to be stacked and coupled to each other via the hybrid copper bonding process as previously shown and discussed in FIG. 1G (e.g., the end product 140). For example, the chip package 200 may comprise one or more additional top dies 142 coupled to the one or more top dies 112 and coupled via hybrid copper bonding via the first step 102, the second step 104, and the third step 106 of the method 100. In some embodiments, the support die 132 may comprise the microfluidic channels 136 and/or the bonding film 138 to support the increased power density created by having the more than one top dies 112, 142 stacked within the chip package 200.

The embodiments shown or the examples given do not limit the number of configurations that the chip package 200 may have. For example, the chip package 200 may be configured to stack any number of top dies 112, 142 within the chip package via hybrid copper bonding. Further, in some embodiments, the chip package 200 may be configured to have three or more top dies 112 and/or bottom dies 114 on the same planarized surface (e.g., aligned horizontally on the same interconnecting layer 120, 122) via hybrid copper bonding.

Figure 3A:
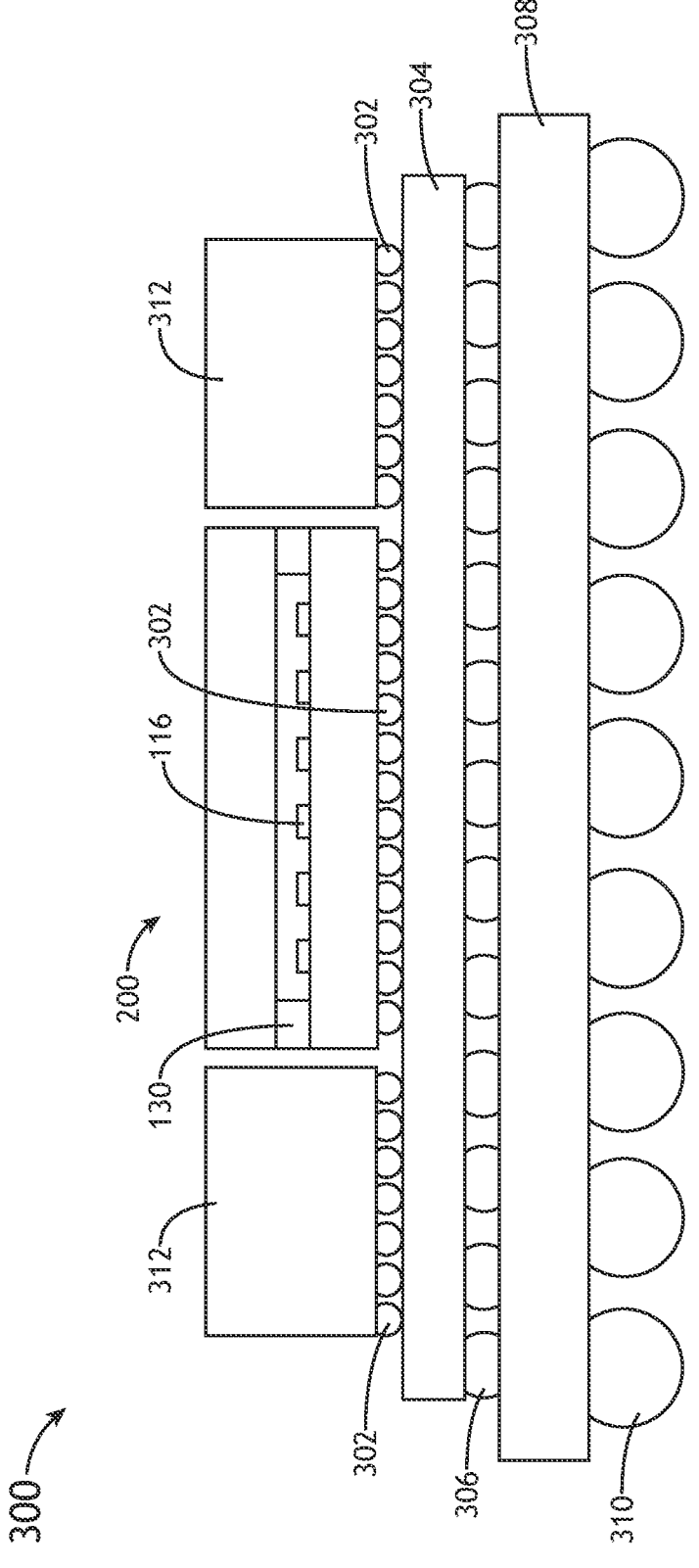
FIG. 3A shows a front cross-sectional view of a semiconductor package.

Referring to FIG. 3A, a front cross-sectional view of a semiconductor package 300 is shown, in accordance with one or more embodiments of the present disclosure. The applicant notes that the chip package 200 may be configured to be a component of the semiconductor package 300 and the chip package 200 may also be an end product 140 of the method 100 described previously herein and that the embodiments and enabling components in the context of the method 100 for manufacturing the end product 140 should be interpreted to extend to the chip package 200 as used in the semiconductor package 300. It is further noted, however, that the semiconductor package 300 is not limited to the architecture of the method 100, the end product 140, or the chip package 200 disclosed previously herein.

In some embodiments, the semiconductor package 300 may comprise a first plurality of microbumps 302, one or more of the chip packages 200, an interposer 304, a second plurality of microbumps 306, a substrate 308, a third plurality of microbumps 310, and one or more package fillers 312 (e.g., compute die, memory die, I/O die, or the like). For example, a first plurality of microbumps 302 (which may encompass the plurality of microbumps 134 coupled to the one or more chip packages 200) may be coupled to a first surface of the one or more package fillers 312. For example, the one or more chip packages 200 may be coupled to the first plurality of microbumps 302 (e.g., the plurality of microbumps 134) and the one or more package fillers 312 may also be coupled to the first plurality of microbumps 302. The first plurality of microbumps 302 may comprise solder bumps that provide a coupling point between the one or more package fillers 312 and the interposer 304 and a coupling point between the one or more chip packages 200 and the interposer 304. The first plurality of microbumps 302 may be coupled to a first surface of the interposer 304, a second surface of the interposer 304 may be coupled to the second plurality of microbumps 306, a first surface of the substrate 308 may be coupled to the second plurality of microbumps 306, and a second surface of the substrate 308 may be coupled to the third plurality of microbumps 310.

As discussed previously herein, the interposer 304 is an electrical interface that may be used to allow electrical signals to pass through it to another component (e.g., from the chip packages 200 to the package fillers 312). For example, connecting (via the first plurality of microbumps 302) the one or more chip packages 200 to the interposer 304 may provide the signal conductivity 128 between the one or more chip packages 200, the one or more package fillers 312, and the interposer 304. The substrate 308 is a supporting material (e.g., metal oxide) upon which the elements of the semiconductor package 300 (e.g., the chip packages 200, the interposer 304, or the package fillers 312) may be coupled to. The substrate 308 may provide the semiconductor package 300 with a mechanical base support and form an electrical interface (e.g., via the coupled third plurality of microbumps 310) that further allows the semiconductor package 300 to be coupled to various electronic devices (e.g., Printed Circuit Boards).

In some embodiments, a backside of the one or more package fillers 312 may comprise a bare silicon or a backside metallization to enhance the thermal efficiency of the one or more package fillers 312 and further support the thermal conductivity of the semiconductor package 300. For example, depositing metal layers on the one or more package fillers 312 may allow for further conductive pathways to be formed between the one or more package fillers 312 and another semiconductor device.

Figure 3B:
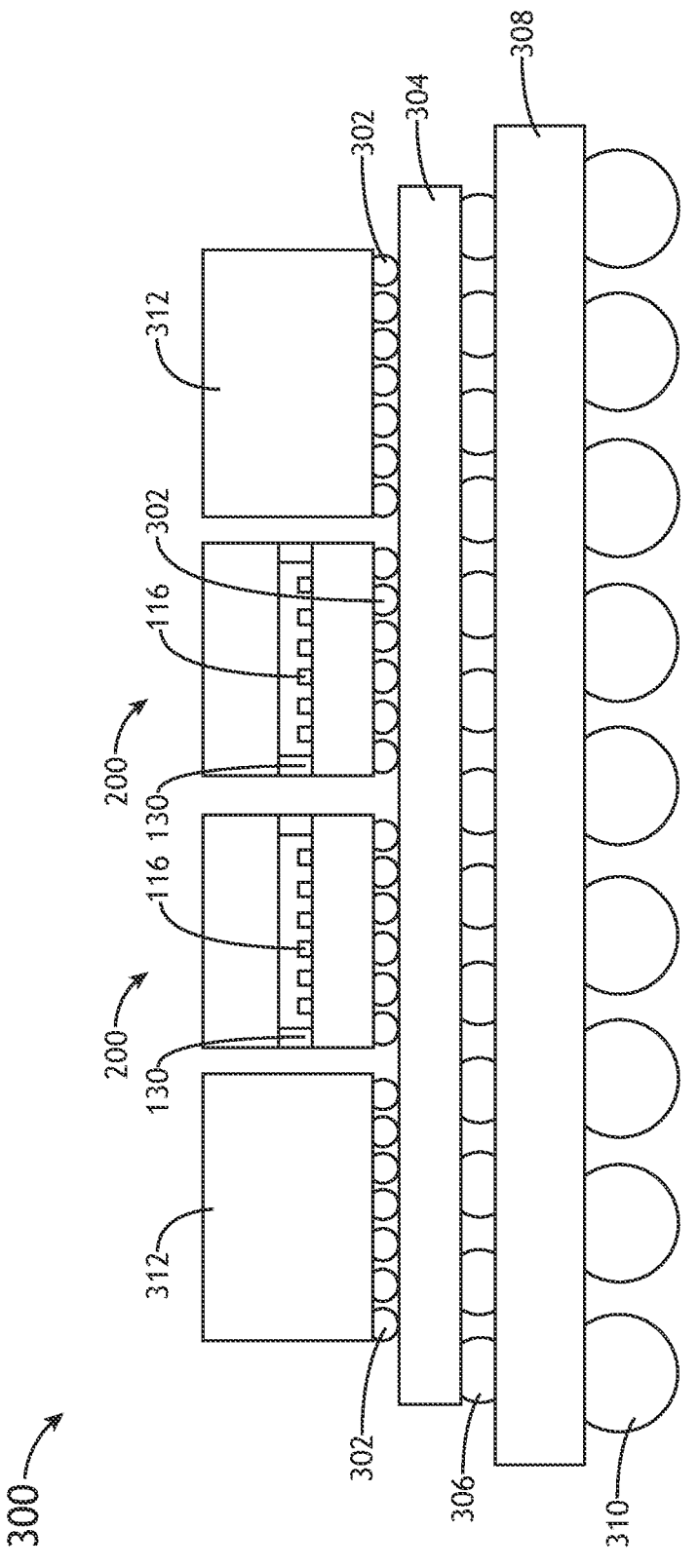
FIG. 3B to FIG. 3D show alternative embodiments of the semiconductor package in FIG. 3A.

Referring to FIG. 3B, an alternative embodiment of the semiconductor package 300 is shown, in accordance with one or more embodiments of the present disclosure. In some embodiments, the semiconductor package 300 may comprise two or more of the chip packages 200 that may be coupled to the interposer 304 via the first plurality of microbumps 302.

Figure 3C:
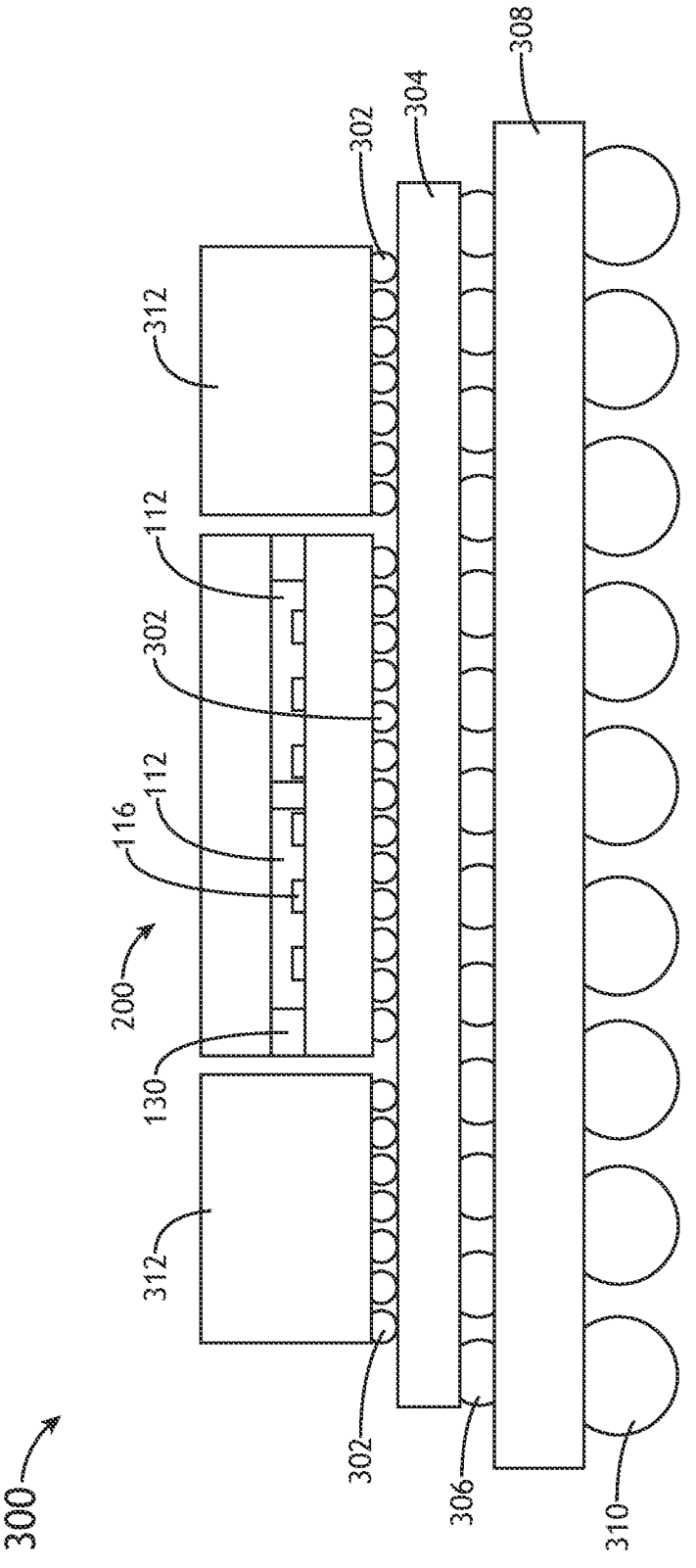

Referring to FIG. 3C, an alternative embodiment of the semiconductor package 300 is shown, in accordance with one or more embodiments of the present disclosure. In some embodiments, the one or more chip packages 200 may be configured to comprise two of the one or more top dies 112 horizontally aligned and one of the one or more bottom dies 114 (as shown in FIGS. 1G, 2C, and 2D). In some embodiments (not shown), the chip package 200 may comprise two or more top dies 112, 142 to be stacked and coupled to each other via the hybrid copper bonding process as previously shown and discussed in FIG. 1G (e.g., the end product 140). For example, the chip package 200 may comprise one or more additional top dies 142 coupled to the one or more top dies 112 and coupled via hybrid copper bonding via the first step 102, the second step 104, and the third step 106 of the method 100. In some embodiments, the support die 132 may comprise the microfluidic channels 136 and/or the bonding film 138 to support the increased power density created by having the more than one top dies 112, 142 vertically stacked within the chip package 200.

Figure 3D:
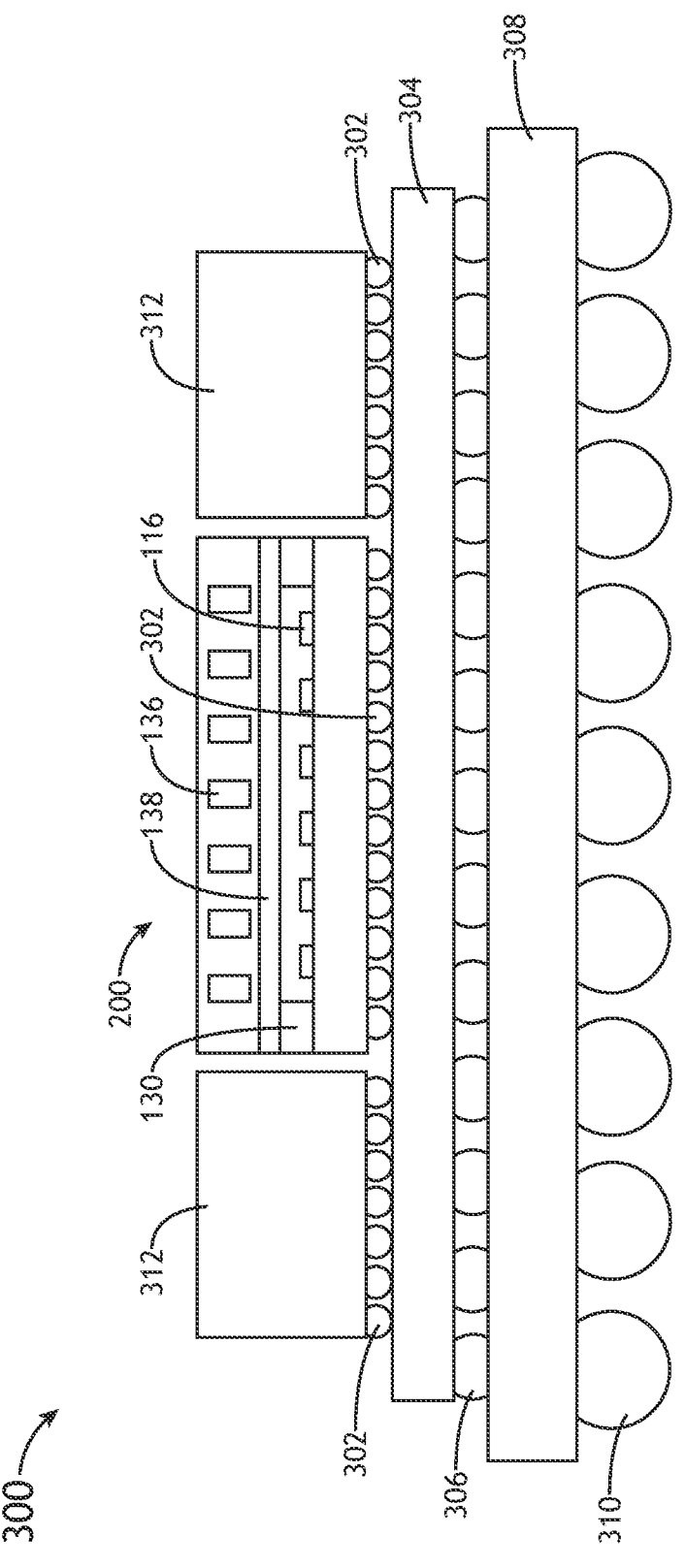

Referring to FIG. 3D, an alternative embodiment of the semiconductor package 300 is shown, in accordance with one or more embodiments of the present disclosure. In some embodiments, the one or more chip packages 200 may contain the microfluidic channels 136 and the bonding film 138. The embodiments or examples given do not limit the number of configurations the semiconductor package 300 may have.

Referring to FIG. 4, a top cross-sectional view 402 and a side cross-sectional view 404 of the support die 132 with the microfluidic channels 136 is shown, in accordance with one or more embodiments of the present disclosure. As disclosed previously herein, the support die 132 shown in the method 100, the chip package 200, and the semiconductor package 300 may contain the one or more microfluidic channels 136. The microfluidic channels 136 may improve the thermal heat transfer within the chip package 200. For example, the microfluidic channels 136 may be filled with fluidic material (e.g., dielectric fluid) that may provide for a liquid-cooling heat transferring process within the chip package 200 while the support die 132 is simultaneously providing passive heat transfer through the regions of its interior that do not interact with the one or more microfluidic channels 136. In some embodiments, the one or more microfluidic channels 136 may be constructed as a single continuous pathway within the support die 132 that may comprise a fluid input point 406 and a fluid output point 408. In some embodiments, the microfluidic channels 136 may have dimensions that may extend to the inner walls of the support die 132.

Referring to FIG. 5, a flow diagram illustrating steps performed in a method 500 for fabricating a chip package 200 is shown, in accordance with one or more embodiments of the present disclosure. Applicant notes that the embodiments and enabling technologies described previously herein in the context of the manufacturing method 100 should, where appropriate to those skilled in the art, be interpreted to extend to the method 500.

In some embodiments, the method 500 includes a step 502 of providing one or more top dies, one or more bottom dies, two or more layers of copper pads, and two or more dielectric layers, wherein a first surface of each of the one or more top dies is coupled to a first interconnecting layer, and a first surface of each of the one or more bottom dies is coupled to a second interconnecting layer, wherein the first and second interconnecting layers each comprise one of the two or more layers of copper pads and one of the two or more dielectric layers.

In some embodiments, the method 500 includes a step 504 of performing a face-to-face coupling of the first and second interconnecting layers between the one or more top dies and the one or more bottom dies via hybrid copper bonding.

In some embodiments, the method 500 includes a step 506 of depositing a material and thinning a second surface of the one or more top dies, wherein both the one or more top dies and the material define a continuous surface. The material may be deposited to at least partially cover the one or more bottom dies and/or fill one or more gaps between the coupled top dies.

In some embodiments, the method 500 includes a step 508 of coupling a first surface of a support die to the second surface of at least one of the one or more top dies.

In some embodiments, the method 500 includes a step 510 of thinning a second surface of at least one of the one or more bottom dies and coupling the second surface of at least one of the one or more bottom dies to a plurality of microbumps.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims. Furthermore, any of the features disclosed in relation to any of the individual embodiments may be incorporated into any other embodiment.

What is claimed is:

1. A chip package, comprising:
one or more top dies;
one or more bottom dies;
a first interconnecting layer;
a second interconnecting layer, wherein a first surface of each of the one or more top dies is coupled to the first interconnecting layer, wherein a first surface of each of the one or more bottom dies is coupled to the second interconnecting layer, wherein the first and second interconnecting layers each comprise:
a layer comprising copper pads and a dielectric layer, wherein the first and second interconnecting layers between the one or more top dies and the one or more bottom dies are coupled via hybrid copper bonding;
a material comprising silicon, wherein the material is deposited to at least partially cover the second interconnecting layer, wherein the one or more top dies and the material define a continuous surface;
a support die, wherein a first surface of the support die is coupled to a second surface of the one or more top dies; and
a plurality of microbumps, wherein the plurality of microbumps are coupled to a second surface of at least one of the one or more bottom dies, the one or more bottom dies comprising through-silicon vias exposed at the second surface, the microbumps coupled to the through-silicon vias and to an interposer.

2. The chip package of claim 1, wherein one or more additional top dies of the one or more top dies are coupled to the second surface of the one or more top dies via the hybrid copper bonding, wherein a second surface of at least one of the one or more additional top dies is coupled to the first surface of the support die via a bonding film.

3. The chip package of claim 1, wherein the support die comprises one or more of the following:
aluminum nitride, graphene on silicon, diamond on silicon, or silicon.

4. The chip package of claim 1, wherein the dielectric layer comprises silicon oxide (SiOx).

5. The chip package of claim 1, wherein the second surface of the one or more top dies and the first surface of the support die are coupled via a bonding film.

6. The chip package of claim 5, wherein the bonding film comprises a filler material and a resin material, wherein the filler material comprises one or more of the following:
silver, aluminum flakes, silver coated copper spheres, silver-diamond, or copper-diamond particles; and
wherein the resin material comprises one or more of the following:

polyimide, benzocyclobutane, epoxy, phenolic, lyure-
thane, or silicon.

7. The chip package of claim 5, wherein the bonding film
comprises a dielectric material, wherein the dielectric mate-
rial comprises one or more of the following:
    silicon and oxygen molecules;
        silicon, oxygen, and nitrogen molecules; or
           silicon, carbon, and nitrogen molecules.

8. The chip package of claim 1, wherein at least one of the
one or more top dies and the one or more bottom dies further
comprises one or more of the following:
    one or more through-silicon-vias (TSV);
        one or more deep trench capacitors; or
           one or more integrated voltage regulators.

9. The chip package of claim 1, wherein at least one of the
one or more top dies and the one or more bottom dies
comprises an active die.

10. The chip package of claim 1, wherein the support die
comprises microfluidic channels.

11. The chip package of claim 1, wherein the material
comprises one or more of the following:
    silicon and oxygen molecules;
        silicon, oxygen, and nitrogen molecules; or
           silicon, carbon, and nitrogen molecules.

\* \* \* \* \*